United States Patent
Tachibana

(10) Patent No.: US 11,888,496 B2
(45) Date of Patent: Jan. 30, 2024

(54) SEMICONDUCTOR INTEGRATED CIRCUIT AND RECEIVER DEVICE

(71) Applicant: Kioxia Corporation, Tokyo (JP)

(72) Inventor: Fumihiko Tachibana, Yokohama (JP)

(73) Assignee: Kioxia Corporation, Tokyo (JP)

( * ) Notice: Subject to any disclaimer, the term of this patent is extended or adjusted under 35 U.S.C. 154(b) by 316 days.

(21) Appl. No.: 17/471,651

(22) Filed: Sep. 10, 2021

(65) Prior Publication Data

US 2022/0311449 A1    Sep. 29, 2022

(30) Foreign Application Priority Data

Mar. 24, 2021    (JP) .................................. 2021-049619

(51) Int. Cl.
*H03M 1/36*    (2006.01)
*G06F 1/08*    (2006.01)

(52) U.S. Cl.
CPC .............. *H03M 1/363* (2013.01); *G06F 1/08* (2013.01)

(58) Field of Classification Search
USPC ........................................................ 341/155
See application file for complete search history.

(56) References Cited

U.S. PATENT DOCUMENTS

| | | | |
|---|---|---|---|
| 9,191,244 B2 | 11/2015 | Tan et al. | |
| 10,142,024 B2 | 11/2018 | Yao et al. | |
| 10,554,452 B2 | 2/2020 | Shiraishi | |
| 11,658,853 B2 * | 5/2023 | Chang | H04B 17/21 375/232 |
| 2003/0058728 A1 * | 3/2003 | Tran | G11C 11/5621 365/230.03 |
| 2011/0167297 A1 * | 7/2011 | Su | H04L 7/0054 714/704 |

(Continued)

FOREIGN PATENT DOCUMENTS

| | | |
|---|---|---|
| JP | 2014-143672 A | 8/2014 |
| JP | 2019-169803 A | 10/2019 |
| JP | 2020-502916 A | 1/2020 |

OTHER PUBLICATIONS

Choi et al. "A 0.1-pJ/b/dB 28-Gb/s Maximum-Eye Tracking, Weight-Adjusting MM CDR and Adaptive DFE with Single Shared Error Sampler" 2020 Symposia on VLSI Technology and Circuits, Jun. 2020, 2 pages.

(Continued)

*Primary Examiner* — Lam T Mai
(74) *Attorney, Agent, or Firm* — Oblon, McClelland, Maier & Neustadt, L.L.P.

(57) ABSTRACT

A semiconductor integrated circuit according to an embodiment includes an A/D converter, first and second equalizer circuits, and first and second controllers. The first equalizer circuit includes a first tap. The first and second equalizer circuits receive a signal based on a digital signal, and output first and second signals, respectively. The first controller adjusts a phase of a clock signal based on the first signal. The second controller an operation of adjusting a control parameter including a tap coefficient. In the operation, the second controller adjusts a tap coefficient of each of taps of the second equalizer circuit, and adjusts a tap coefficient of the first tap based on an adjustment result of each tap coefficient of the second equalizer circuit.

20 Claims, 25 Drawing Sheets

(56) References Cited

U.S. PATENT DOCUMENTS

| | | | | |
|---|---|---|---|---|
| 2012/0086494 A1* | 4/2012 | Asada | ............... | H04L 25/03878 |
| | | | | 327/307 |
| 2012/0133459 A1* | 5/2012 | Zhuang | ................... | H04B 3/14 |
| | | | | 333/28 R |
| 2014/0169442 A1* | 6/2014 | Hashida | ................ | H04L 7/0029 |
| | | | | 375/232 |
| 2014/0362899 A1* | 12/2014 | Nakao | ..................... | H04L 27/01 |
| | | | | 375/232 |
| 2022/0052884 A1* | 2/2022 | Cai | ................... | H04L 25/03057 |
| 2022/0376960 A1* | 11/2022 | Chang | .................... | H04B 17/21 |

OTHER PUBLICATIONS

Dokania et al., "A 5.9pJ/b10Gb/s Serial Link with Unequalized MM-CDR in 14nm Tri-Gate CMOS" IEEE, ISSCC, Session 10, Advanced Wireline Techniques and PLLs, 10.5, 2015, 3 pages.

Upadhyaya et al. "A Fully Adaptive 19-to-56Gb/s PAM-4 Wireline Transceiver with a Configurable ADC in 16nm FinFET", IEEE, ISSCC, Session 6, Ultra-High-Speed Wireline, 6.4, 2018, 3 pages.

* cited by examiner

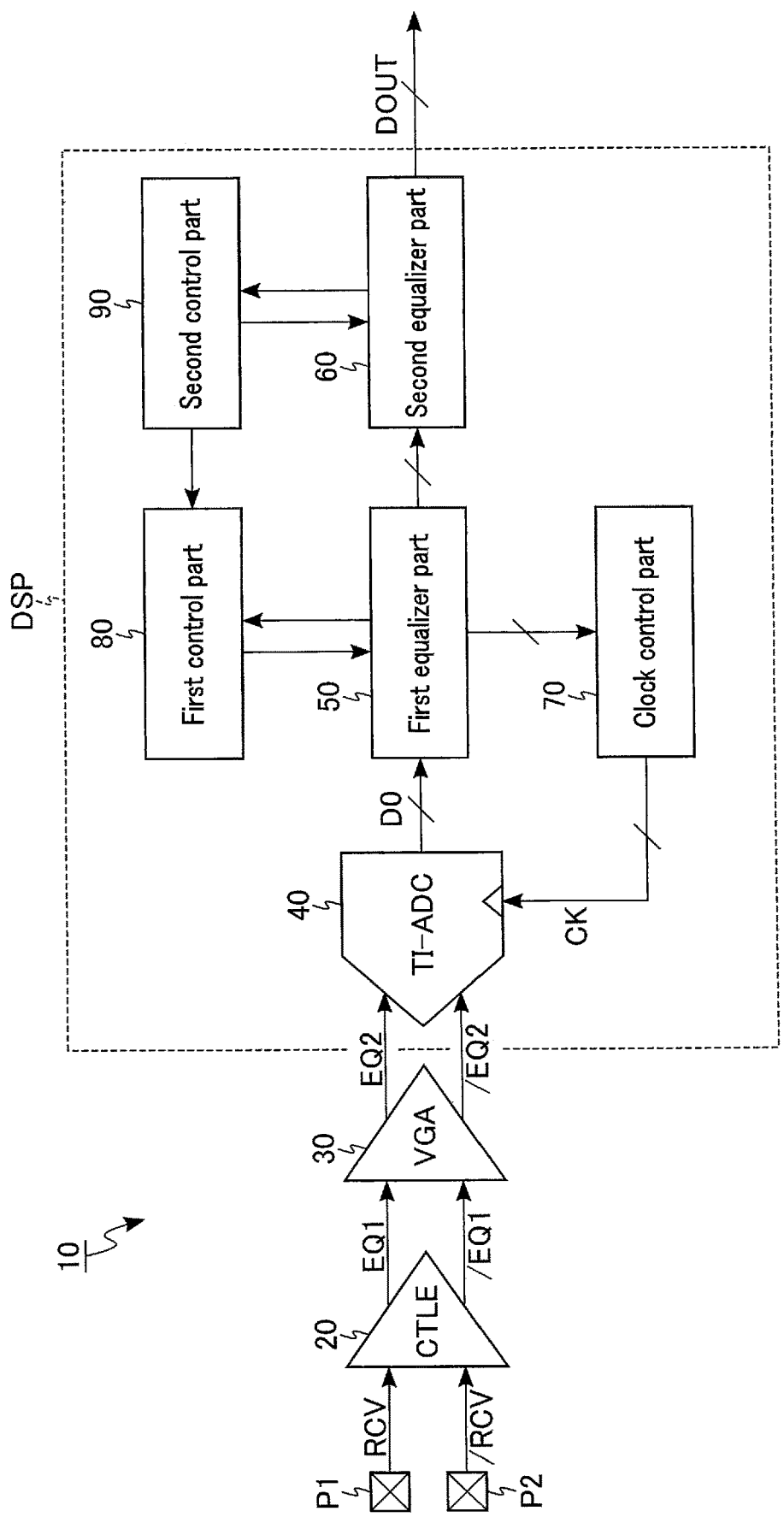
F I G. 3

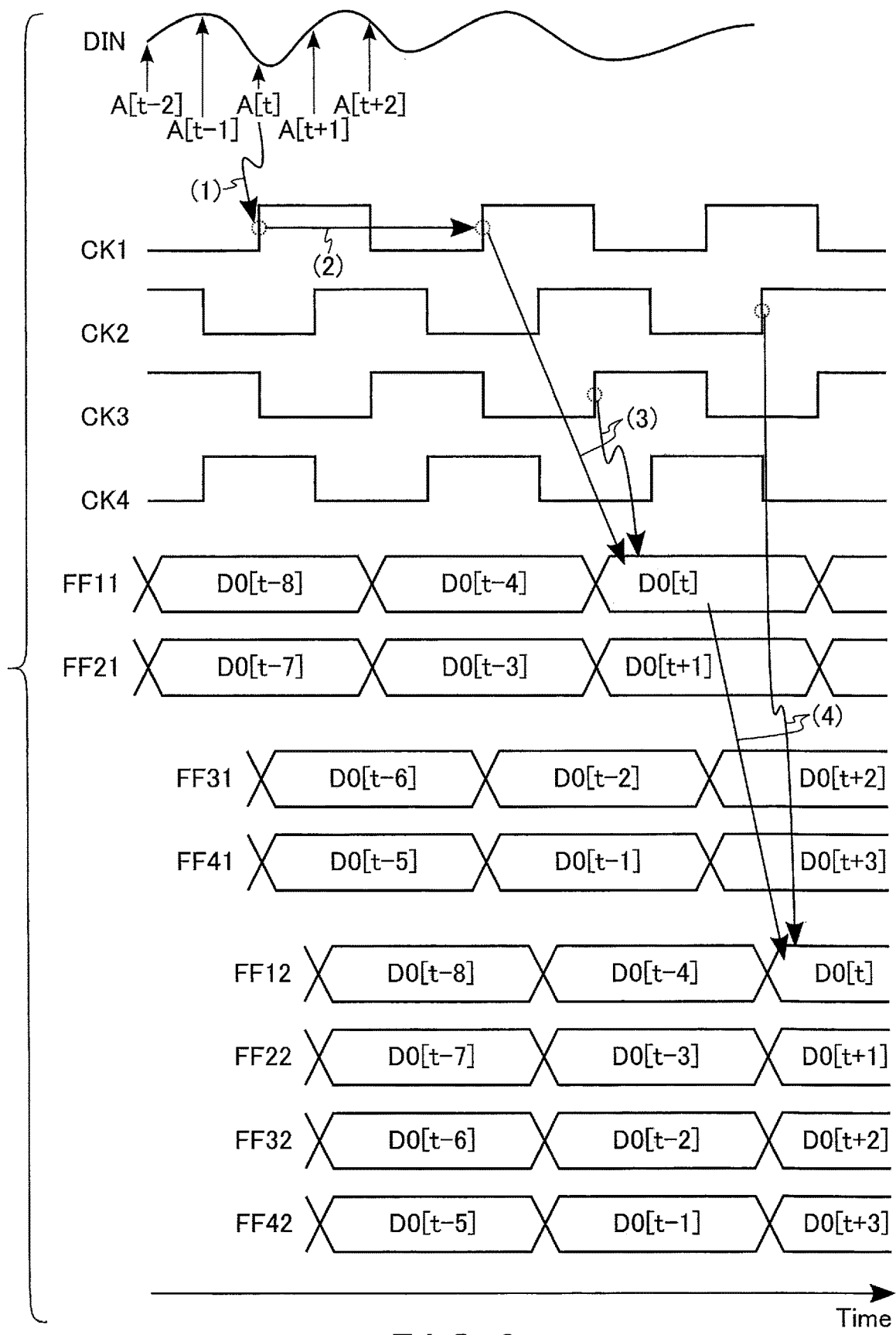
F I G. 6

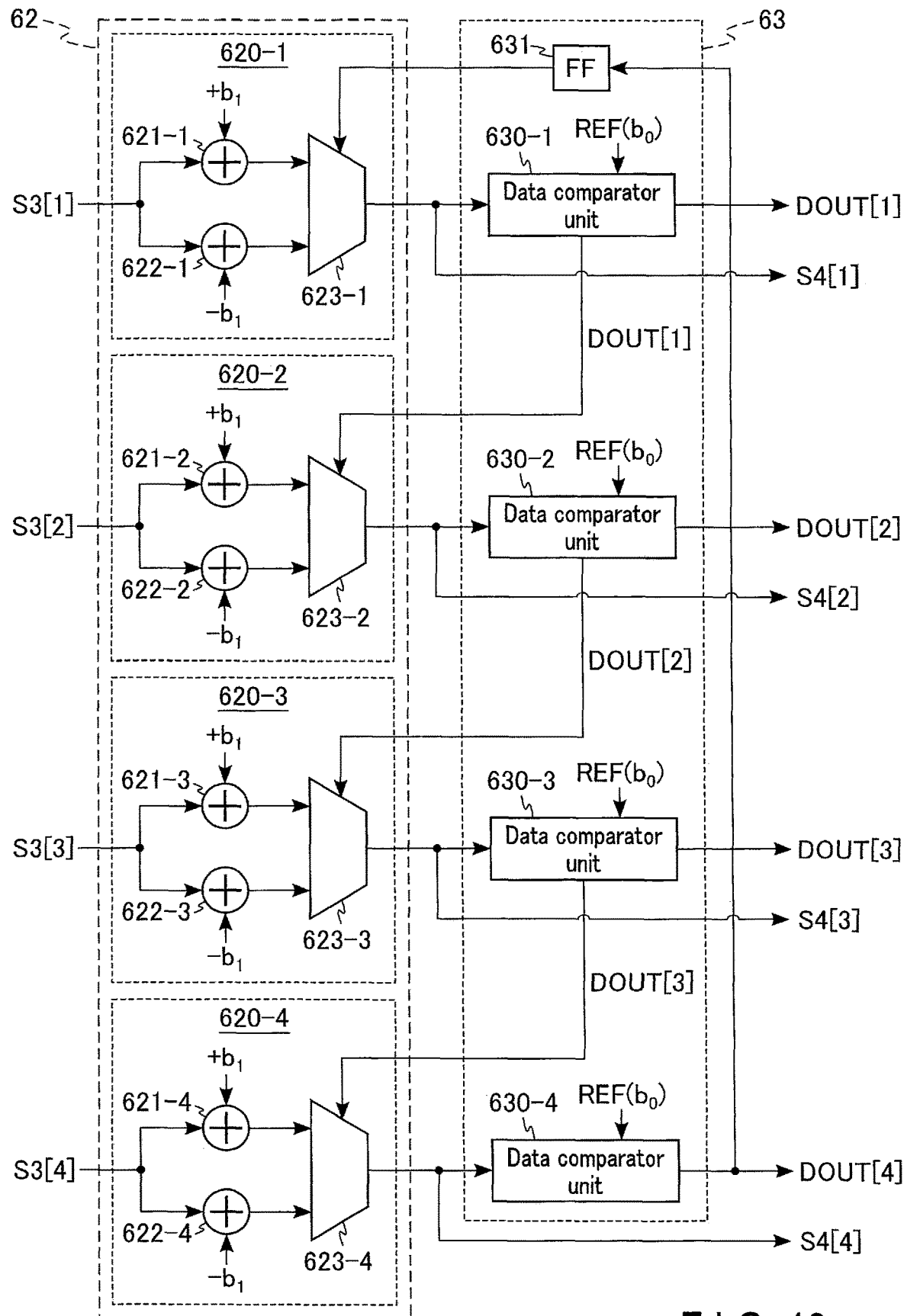
F I G. 10

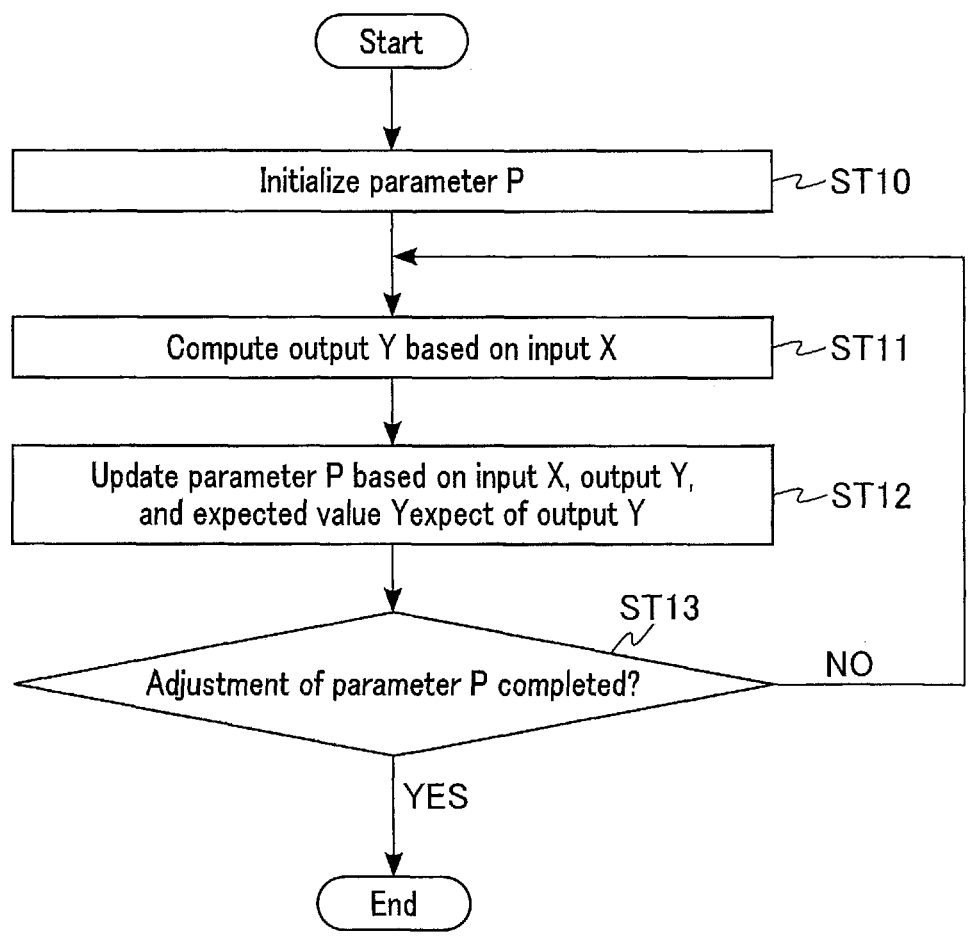
F I G. 14

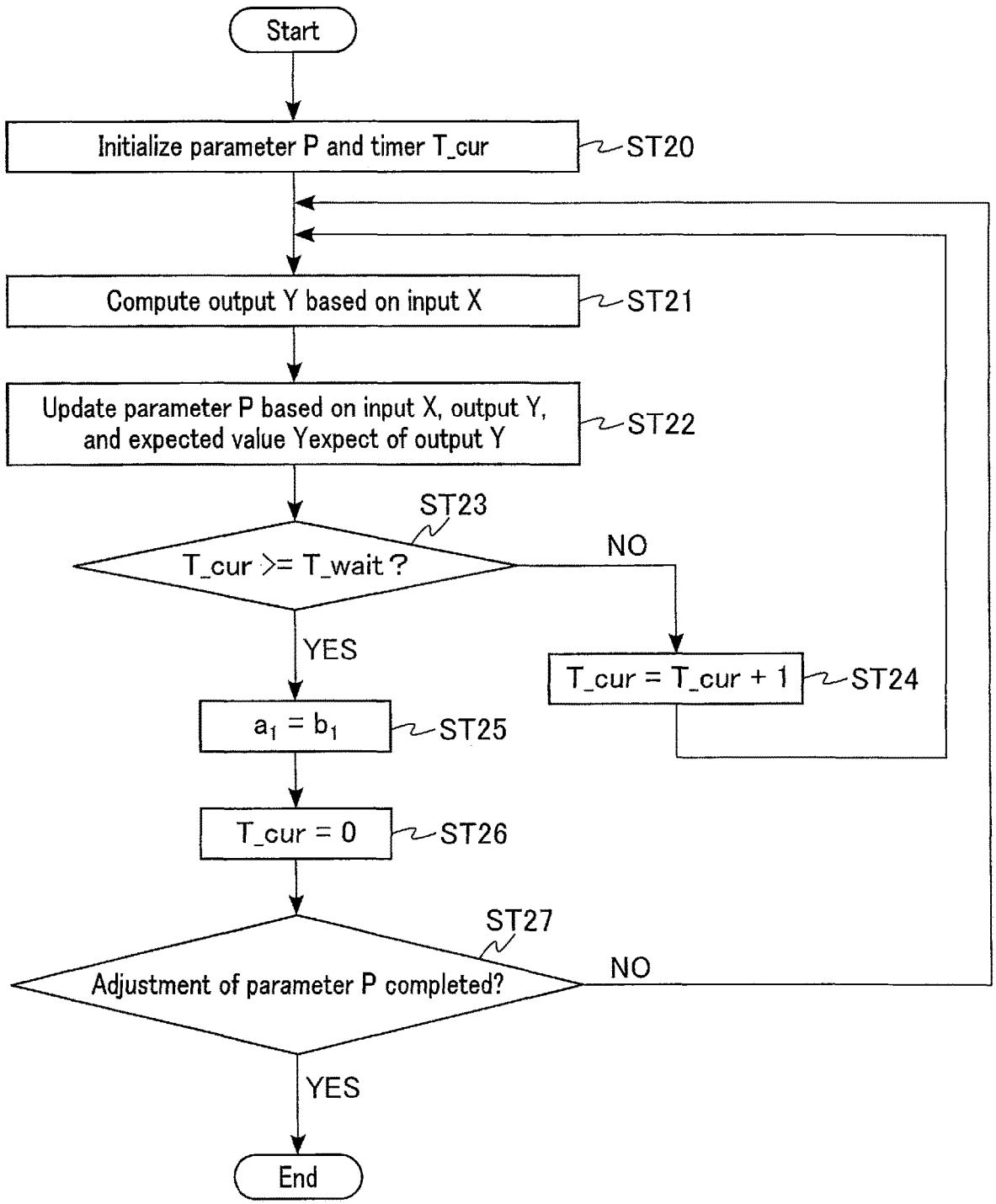
F I G. 15

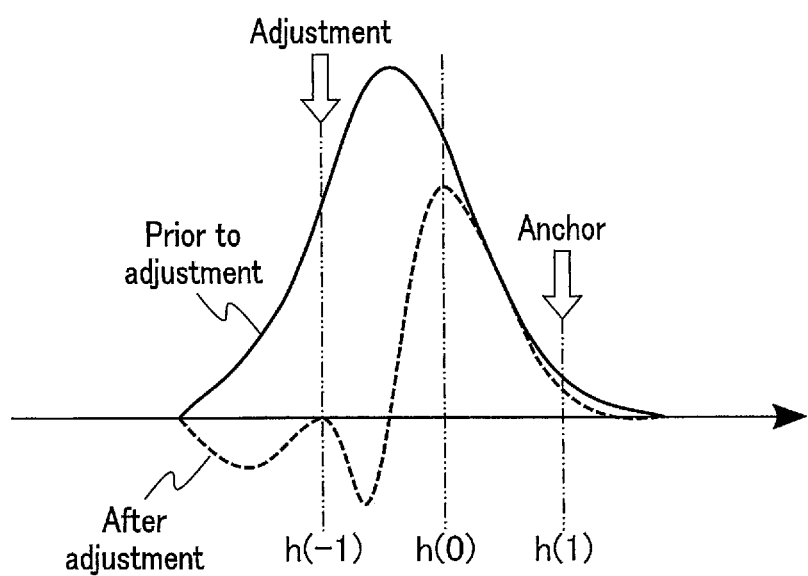
F I G. 18

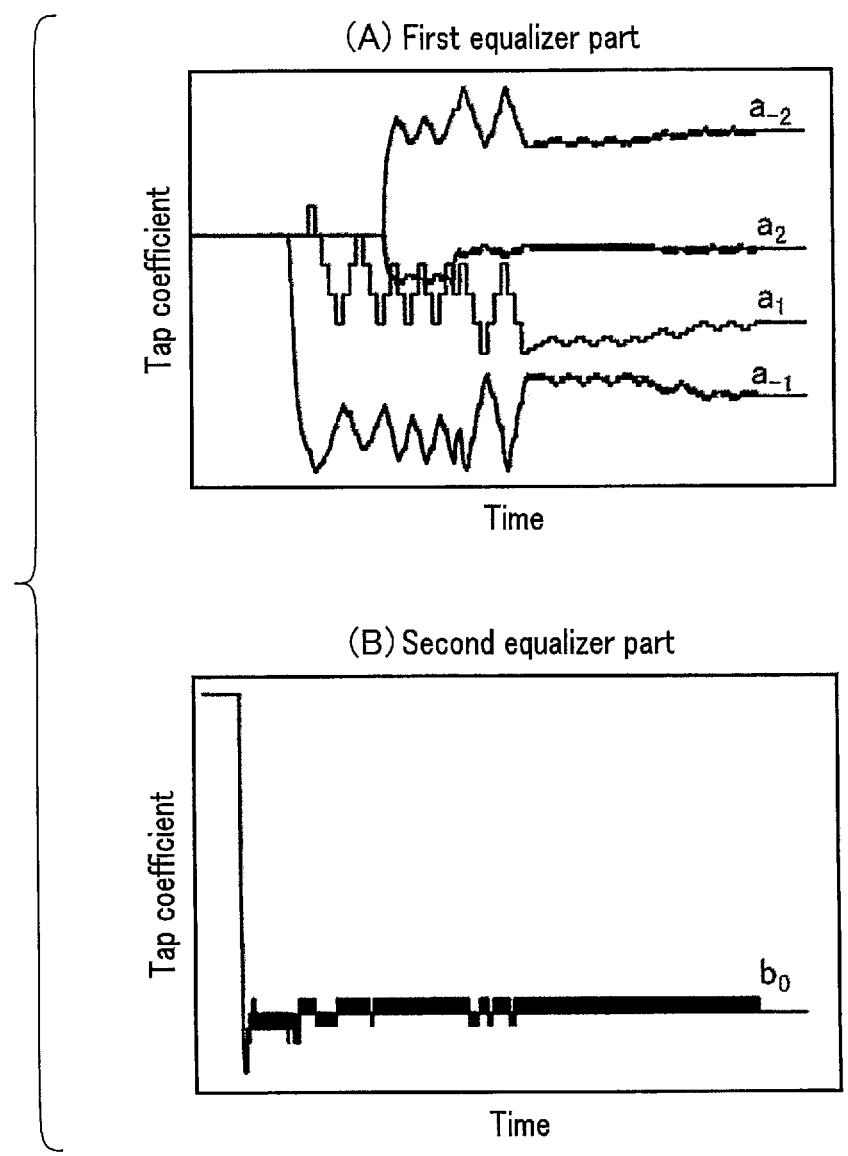
F I G. 20

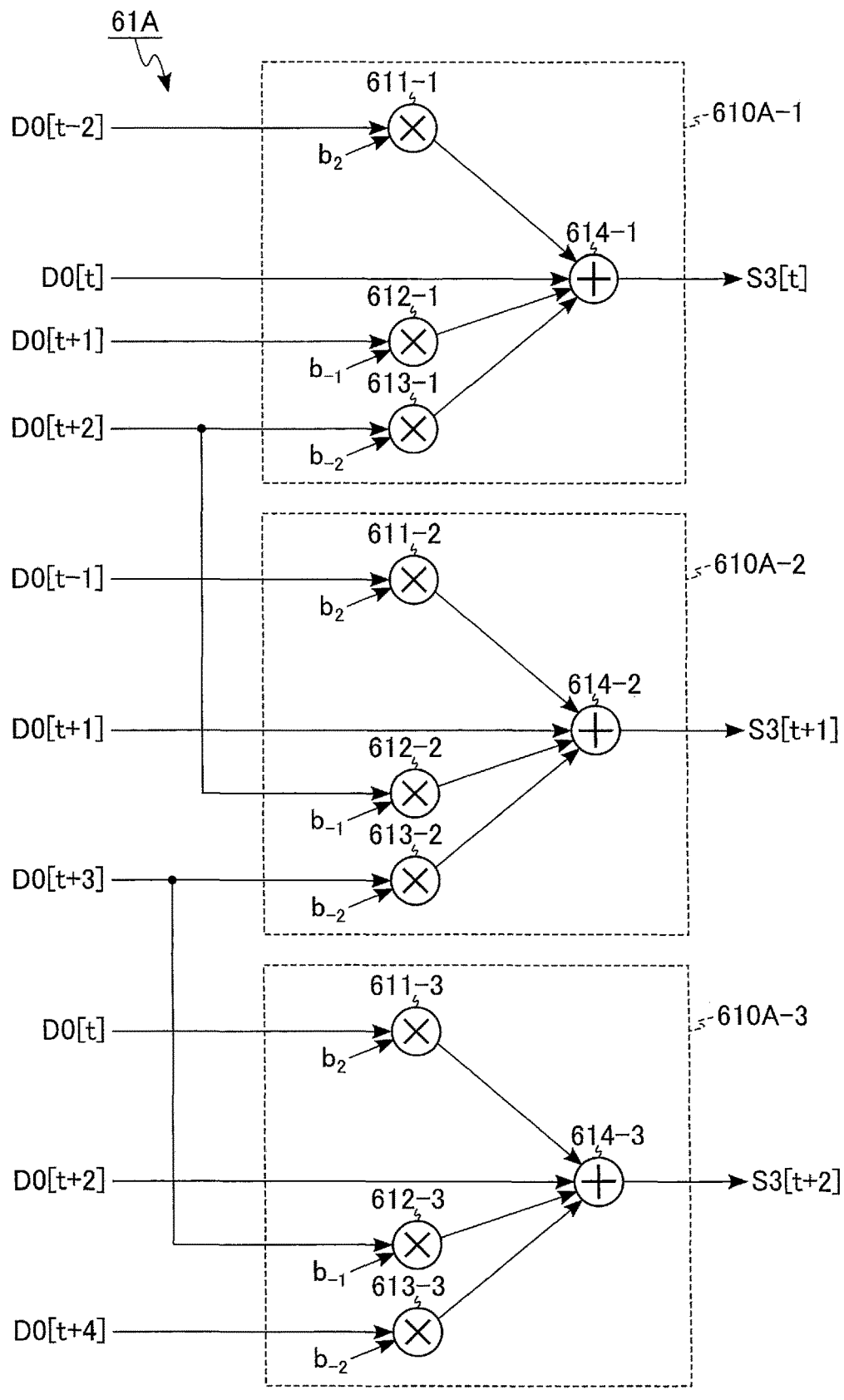
F I G. 23

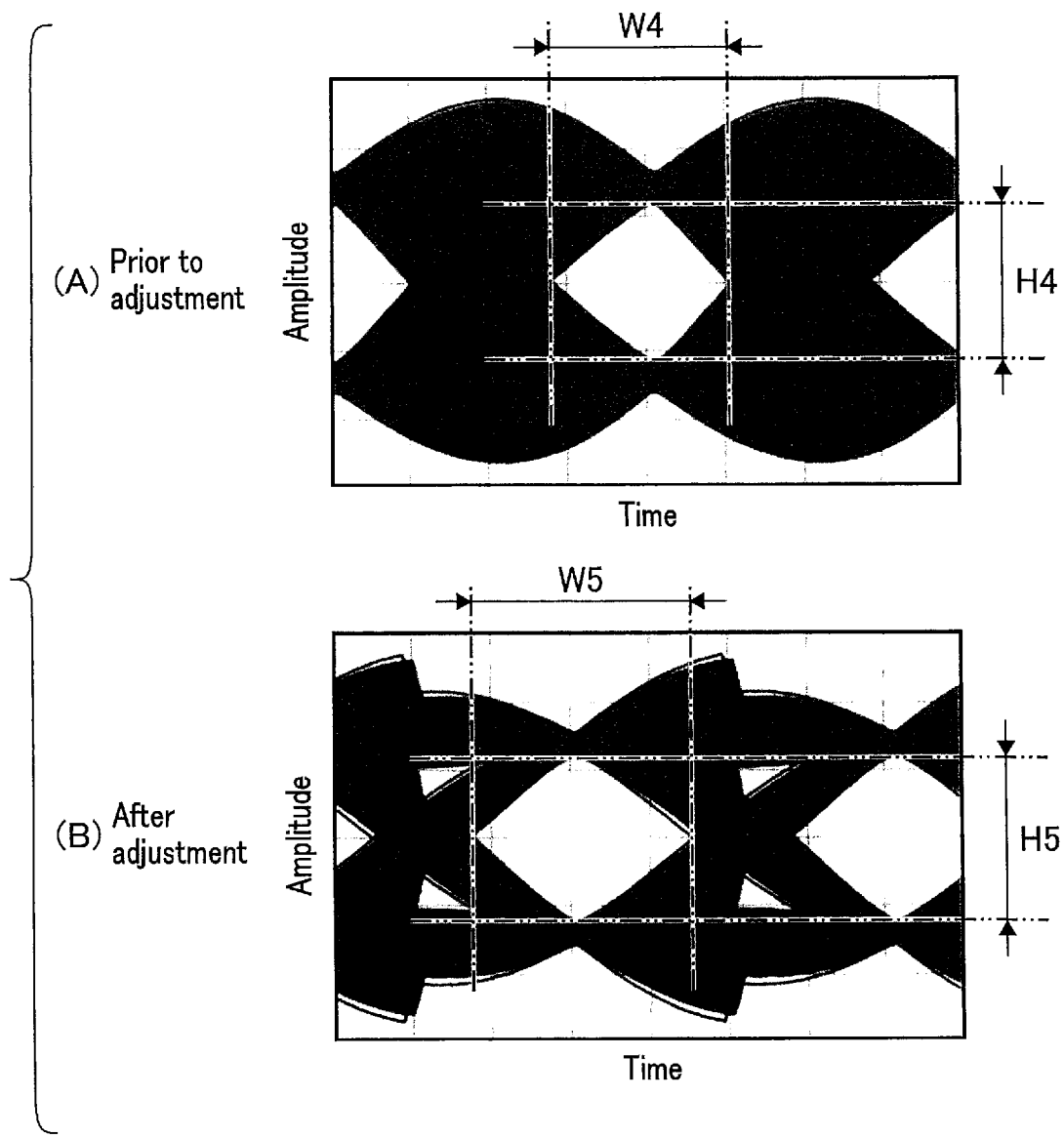
F I G. 28

SEMICONDUCTOR INTEGRATED CIRCUIT AND RECEIVER DEVICE

CROSS-REFERENCE TO RELATED APPLICATIONS

This application is based upon and claims the benefit of priority from Japanese Patent Application No. 2021-049619, filed Mar. 24, 2021, the entire contents of which are incorporated herein by reference.

FIELD

Embodiments described herein relate generally to a semiconductor integrated circuit and a receiver device.

BACKGROUND

A transmitter device (a transmitting device) and a receiver device (a receiving device) are coupled via a transmission line. The receiver device receives a signal that has passed through a transmission line. The receiver device includes an equalizer circuit for compensating for a loss caused by transmission characteristics of the transmission line, the loss is included in the received signal. The equalizer circuit executes an equalization process of the received signal using a clock signal.

BRIEF DESCRIPTION OF THE DRAWINGS

FIG. 3 is a block diagram showing an example of a configuration of a receiver circuit according to the first embodiment.

FIG. 6 is a timing chart for illustrating processings of an A/D converter part included in the receiver circuit according to the first embodiment.

FIG. 10 is a diagram showing an example of a configuration of a DFE part and a second data comparator part included in the receiver circuit according to the first embodiment.

FIG. 14 is a flowchart showing an example of a first parameter adjusting operation of the receiver circuit according to the first embodiment.

FIG. 15 is a flowchart showing an example of a second parameter adjusting operation of the receiver circuit according to the first embodiment.

FIG. 18 is a schematic view for illustrating effects of a timing adjustment method of the receiver circuit according to the first embodiment.

FIG. 20 is a schematic diagram showing an example of a simulation result of first and second parameter adjusting operations of the receiver circuit according to the second embodiment.

FIG. 23 is a diagram showing an example of a configuration of a second FFE part included in the receiver circuit according to the third embodiment.

FIG. 28 is a schematic diagram showing an example of changes in eye pattern in the second parameter adjusting operation of the receiver circuit according to the fifth embodiment.

DETAILED DESCRIPTION

Figure 1:
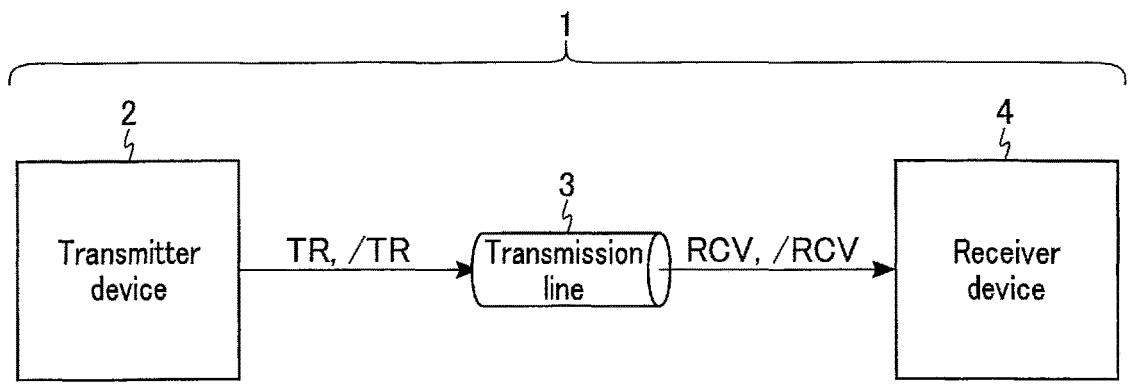
FIG. 1 is a block diagram showing an example of a configuration of a transmission system including a receiver device according to a first embodiment.

In general, according to one embodiment, a semiconductor integrated circuit includes, an A/D converter, a first equalizer circuit, a first data comparator circuit, a second equalizer circuit, a second data comparator circuit, a first control circuit, and a second control circuit. The A/D converter is configured to convert an analog signal into a digital signal based on a clock signal. The first equalizer circuit includes a plurality of taps including a first tap that is one tap after a center tap. The first equalizer circuit receives a signal based on the digital signal and outputs a first signal. The first data comparator circuit is configured to determine data based on the first signal and output the determined data as first data. The second equalizer circuit includes a plurality of taps. The second equalizer circuit receives a signal based on the digital signal and outputs a second signal. The second data comparator circuit is configured to determine data based on the second signal and output the determined data to an outside. The first control circuit is configured to adjust a phase of the clock signal based on the first signal and the first data, and input the adjusted clock signal to the A/D converter. The second control circuit is configured to control each of the first equalizer circuit and the second equalizer circuit, and execute an operation of adjusting a control parameter including a tap coefficient. In the operation, the second control circuit is configured to adjust a tap coefficient of each of the taps of the second equalizer circuit, and adjust a tap coefficient of the first tap based on an adjustment result of each tap coefficient of the second equalizer circuit.

Hereinafter, embodiments will be described with reference to the drawings. Each embodiment illustrates a device and a method for embodying the technical idea of the invention. The drawings are either schematic or conceptual. In the description that follows, components having approximately the same function and configuration will be assigned a common reference numeral. A numeral, etc. following letters or numbers constituting a reference symbol is used to distinguish between components referred to by reference symbols including the same letters and having the same configuration. If components represented by reference symbols including the same letters need not be distinguished, such components are assigned reference symbols including only the same letters or numerals. Reference signs to which the same "hyphen+number" is appended denote that they belong to the same group. A signal name to which "/" is appended at its head indicates that it is an inversion signal.

[1] First Embodiment

Hereinafter, a description will be given of a receiver device and a receiver circuit according to a first embodiment.

[1-1] Configuration
[1-1-1] Configuration of Transmission System 1

FIG. 1 is a block diagram showing an example of a configuration of a transmission system 1 including a receiver device 4 according to the first embodiment. The transmission system 1 has a configuration that allows data to be transmitted from one device or circuit to another device or circuit via high-speed serial communications. As shown in FIG. 1, the transmission system 1 includes a transmitter device (also referring to a transmitting device) 2, a transmission line 3, and a receiver device (also referring to a receiving device) 4. The transmission system 1 may be configured of a plurality of devices or circuits provided on the same printed substrate, or may be configured of a plurality of devices or circuits provided on different printed substrates. The printed substrate corresponds to a printed circuit board or a printed board.

The transmitter device 2 is configured to send signals TR and /TR to the receiver device 4 via the transmission line 3. The sent signals TR and /TR are a set of differential signals that transmit a single signal. Each of the sent signals TR and /TR is, for example, a pulse signal with a digital value that is distinguishable between "0" and "1" in each of continuous times (unit intervals: UIs). That is, information encoded with the pulse signal is transmitted to the receiver device 4 from the transmitter device 2 via the transmission line 3. The transmitter device 2 may allocate single-bit data (of two values) or multiple-bit data (of four or more k values) to a single pulse signal to be sent.

The transmission line 3 is a physical or spatial transmission medium for transmitting signals TR and /TR to the receiver device 4, and is, for example, an interconnect that couples the transmitter device 2 and the receiver device 4. The transmission line 3 may have various transmission characteristics according to the physical structure and material of the transmission medium. The transmission characteristics of the transmission line 3 have, for example, frequency characteristics that involve a loss of gain in a certain frequency band. Through the intervention of the transmission line 3, the signals TR and /TR sent by the transmitter device 2 suffer a loss according to the transmission characteristics of the transmission line 3.

The receiver device 4 receives sent signals TR and /TR (hereinafter referred to received signals RCV and /RCV) that have suffered a loss through the intervention of the transmission line 3. The received signals RCV and /RCV are a set of differential signals used to transmit a single signal. The receiver device 4 decodes information contained in the sent signals TR and /TR based on the received signals RCV and /RCV. The receiver device 4 includes a receiver circuit for correctly decoding information contained in the sent signals TR and /TR. The receiver circuit has a functional configuration for compensating for a loss caused in a certain frequency band due to the transmission characteristics of the transmission line 3. The receiver circuit may also be referred to as an equalizer circuit, a semiconductor integrated circuit, or the like. Details of the receiver circuit will be described later.

(Concrete Example of Transmission System 1)

Figure 2:
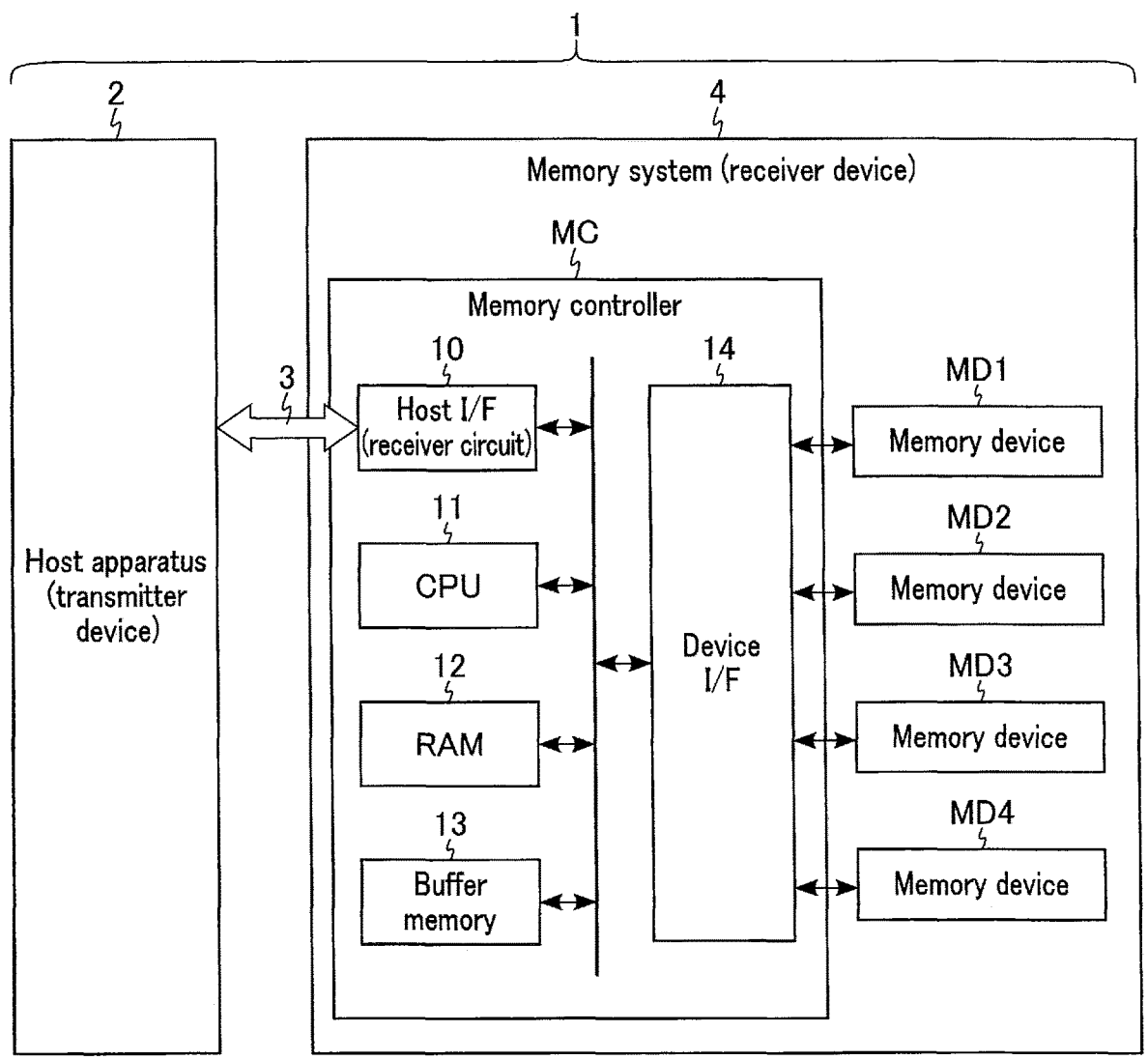
FIG. 2 is a block diagram showing a concrete example of a transmission system including the receiver device according to the first embodiment.

FIG. 2 is a block diagram showing a concrete example of the transmission system 1 according to the first embodiment. In an example of the transmission system 1 shown in FIG. 2, the receiver device 4 is a memory system, and the transmitter device 2 is a host apparatus of the memory system. Specifically, the memory system (receiver device 4) is configured to be couplable to a host apparatus (transmitter device 2) via the transmission line 3, and includes, for example, a plurality of memory devices MD1 to MD4 and a memory controller MC.

Each of the memory devices MD includes a plurality of memory cells, and stores data in a non-volatile manner. The memory devices MD are, for example, NAND flash memories. The memory devices MD1 to MD4 are formed on different semiconductor chips. The number of memory devices MD included in the memory system (receiver device 4) may be designed to be any number.

The memory controller MC manages the storage space of each memory device MD, and may give an order for reading, writing, erasure, etc. to each memory device MD in response to an order from the host apparatus (transmitter device 2). The memory controller MC includes, for example, a host interface (I/F) 10, a central processing unit (CPU) 11, a random access memory (RAM) 12, a buffer memory 13, and a device interface (I/F) 14.

The host interface 10 is coupled to the host device (transmitter device 2) via the transmission line 3, and manages communications between the memory controller MC and the host device (transmitter device 2). The host interface 10 transfers a request and data received from the host device (transmitter device 2) to the CPU 11 and the buffer memory 13. The host interface 10 transfers the data in the buffer memory 13 to the host device in response to the order from the CPU 11. (Hereinafter, the host interface 10 is also referred to as a "receiver circuit 10".)

The CPU 11 controls the entire operation of the memory controller MC. For example, the CPU 11 issues a write order including a command, an address, etc. in response to a write request received from the host device (transmitter device 2). The issued write order is transferred to one of the memory devices MD, and the memory device MD to which the write order is transferred executes a write operation based on the write order. The CPU 11 may execute a read operation similarly to a write operation.

The RAM 12 is used as a work area of the CPU 11. The RAM 12 stores firmware for managing a plurality of memory devices MD, various types of management tables, etc. Examples of the RAM 12 that may be used include semiconductor memories such as a static random access memory (SRAM) and a dynamic random access memory (DRAM).

The buffer memory 13 temporarily stores read data received by the memory controller MC from the memory device MD, write data received by the memory controller MC from the host device (transmitter device 2), etc. The buffer memory 13 may be externally coupled to the memory controller MC, or may be integrated with the RAM 12.

The device interface 14 manages communications between the memory controller MC and each memory device MD. The device interface 14 transfers the order issued by the CPU 11 to one of the memory devices MD. During a write operation, the device interface 14 transfers the write data stored in the buffer memory 13 to one of the memory devices MD. During a read operation, the device interface 14 transfers read data received from one of the memory devices MD to the buffer memory 13.

The memory device MD and the memory controller MC described above may in combination configure a single semiconductor memory device. Examples of such a semiconductor memory device include a memory card such as an SD™ card, a solid-state drive (SSD), a Universal Flash Storage (UFS) device, etc. The device used as the transmission system 1 may be other than a memory system. Hereinafter, a detailed configuration will be given of the receiver circuit 10 according to the first embodiment.

[1-1-2] Configuration of Receiver Circuit 10

FIG. 3 is a block diagram showing an example of a configuration of the receiver circuit 10 according to the first embodiment. As shown in FIG. 3, the receiver circuit 10 includes, for example, pads P1 and P2, a continuous-time linear equalizer (CTLE) 20, a variable-gain amplifier (VGA) 30, an analog-to-digital (A/D) converter part 40, a first equalizer part 50, a second equalizer part 60, a clock control part 70, a first control part 80, and a second control part 90.

Each of the pads P1 and P2 is a terminal configured to be couplable to the transmission line 3, and is coupled to the CTLE 20. In the present example, a received signal RCV is input to the pad P1, and a received signal /RCV is input to the pad P2.

The CTLE 20 is an amplifier circuit with frequency characteristics that compensate for the frequency characteristics of the transmission line 3. The CTLE 20 amplifies and compensates for the received signals RCV and /RCV input via the pads P1 and P2. The CTLE 20 inputs the amplified and compensated received signals RCV and /RCV (hereinafter referred to as "equalization signals EQ1 and /EQ1") to the VGA 30.

The VGA 30 is an amplifier circuit capable of varying its gain. The VGA 30 amplifies the equalization signals EQ1 and /EQ1 input from the CTLE 20. The VGA 30 inputs the amplified equalization signals EQ1 and/EQ1 (hereinafter referred to as "equalization signals EQ2 and/EQ2") to the A/D converter part 40.

The A/D converter part 40 is, for example, a time-interleaved A/D converter (TI-ADC) circuit. The A/D converter part 40 converts equalization signals EQ2 and /EQ2 (analog signals) input from the VGA 30 into digital signals based on a plurality of clock signals CK input from the clock control part 70. The A/D converter part 40 outputs a digital value D0 obtained by the conversion to the first equalizer part 50.

Each of the first equalizer 50 and the second equalizer 60 is a circuit that amplifies and compensates for the input signal. In the first embodiment, data DOUT determined via the first equalizer 50 and the second equalizer 60 is output from the receiver circuit 10.

The clock control part 70 is a circuit that adjusts the timing of the clock signal CK based on the signal, etc. output from the first equalizer 50. The clock control part 70 inputs the adjusted clock signal CK to the A/D converter part 40.

Each of the first control part 80 and the second control part 90 is a control circuit capable of controlling control parameters of the first equalizer 50 and the second equalizer 60. The first control part 80 and the second control part 90 are capable of computing more favorable control parameters based on signals, etc. output from the first equalizer 50 and the second equalizer 60. The second control part 90 is capable of passing part of the computation result to the first control part 80.

Hereinafter, a group of the A/D converter part 40, the first equalizer part 50, the second equalizer part 60, the clock control part 70, the first control part 80, and the second control part 90 included in the receiver circuit 10 is referred to as a "digital signal processor DSP". Next, a detailed configuration of the digital signal processor DSP will be described.

Figure 4:
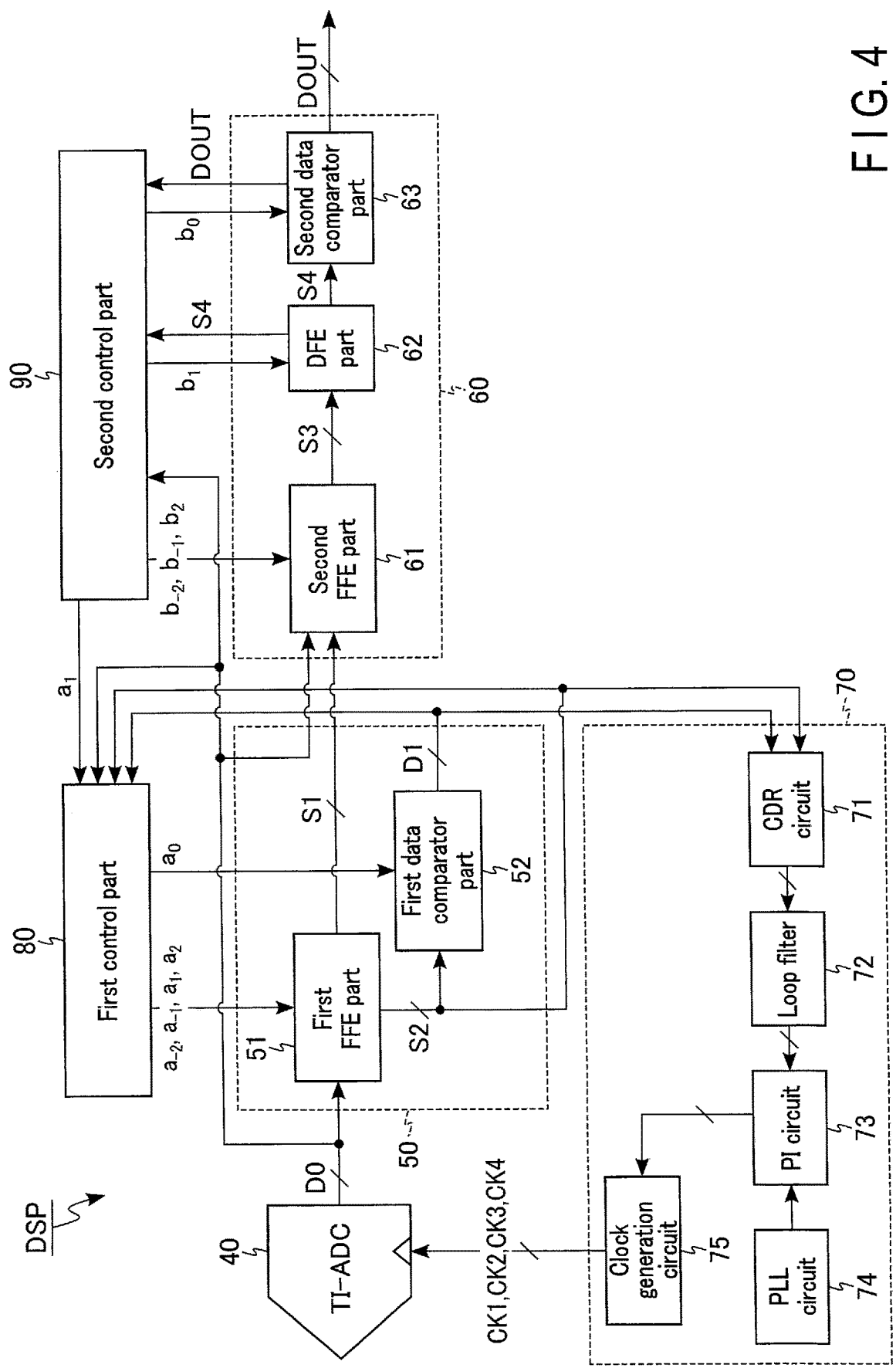
FIG. 4 is a block diagram showing an example of a detailed configuration of a digital signal processor of the receiver circuit according to the first embodiment.

FIG. 4 is a block diagram showing an example of a detailed configuration of the digital signal processor DSP of the receiver circuit 10 according to the first embodiment. As shown in FIG. 4, the first equalizer 50 includes a first FFE part 51 and a first data comparator part 52. The second equalizer 60 includes a second FFE part 61, a DFE part 62, and a second data comparator part 63. The clock control part 70 includes a clock and data recovery (CDR) circuit 71, a loop filter 72, a phase interpolator (PI) circuit 73, a phase-locked loop (PLL) circuit 74, and a clock generation circuit 75. A digital value D0 from the A/D converter part 40 is further input to each of the first control part 80, the second control part 90, and the second FFE part 61.

The first FFE part 51 includes a plurality of feed-forward equalizers (FFEs). A plurality of digital values D0 are input in parallel to the first FFE part 51 in, for example, each cycle of analog-to-digital conversion (A/D conversion) by the A/D converter part 40. The first FFE part 51 performs compensation processing for each of the input digital values D0 using some of the digital values of the previous or subsequent unit intervals, and generates a first signal S1 and a second signal S2 with different compensation methods. The first signal 51 is input to the second equalizer 60. The second signal S2 is input to the first data comparator part 52, a CDR circuit 71, and the first control part 80.

The first data comparator part 52 generates first data D1 based on the input second signal S2. The first data comparator part 52 inputs the first data D1 to the CDR circuit 71 and the first control part 80.

The second FFE part 61 includes a plurality of FFE circuits. A plurality of first signals S1 are input in parallel to the second FFE part 61 in, for example, each cycle of A/D conversion by the A/D converter part 40. The second FFE part 61 performs compensation processing for each of the input first signals S1 using some of the first signals S1 of the previous or subsequent unit intervals, and generates a third signal S3. The second FFE part 61 inputs the generated third signals S3 to the DFE part 62 and the second control part 90.

The DFE part 62 includes a plurality of decision feedback equalizers (DFEs). A plurality of third signals are input in parallel to the DFE part 62 in, for example, each cycle of A/D conversion by the A/D converter part 40. The DFE part 62 performs compensation processing for each of the input third signals S3 using some of the third signals S3 of the previous or subsequent unit intervals, and generates a fourth signal S4. Thereafter, the DFE part 62 inputs the generated fourth signal S4 to each of the second data comparator part 63 and the second control part 90.

The second data comparator part 63 generates second data based on the signal processed by the DFE part 62. The second data comparator part 63 inputs the second data to the second control part 90 as data DOUT, and outputs it to an external processing circuit. Examples of the external processing circuit include the CPU 11, the RAM 12, and the buffer memory 13 of the memory controller MC shown in FIG. 2. The destination of the data DOUT output from the receiver circuit 10 may be varied according to the type of information contained in the data DOUT.

The CDR circuit 71 is a circuit that extracts timing of a clock signal included in the received signals RCV and /RCV based on the second signal S2 and the first data D1. Upon receiving the first signal S2 and the first data D1 from the first equalizer 50, the CDR circuit 71 detects a phase shift between these signals. The CDR circuit 71 outputs a value corresponding to the detected phase shift to the loop filter 72.

The loop filter 72 is a filter circuit for determining stability and responsive characteristics of the circuit. The loop filter 72 filters the signal output from the CDR circuit 71, and outputs the filtered signal to the PI circuit 73.

Based on a reference clock signal input from the PLL circuit 74, the PI circuit 73 generates a multiple-phase clock signal from the signal input from the loop filter 72. The PI circuit 73 inputs the generated multiple-phase clock signal to the clock generation circuit 75.

The PLL circuit 74 generates the reference clock signal, and inputs the generated reference clock signal to the PI circuit 73. The reference clock signal adjusts the frequency of a clock signal output from the PI circuit 73 to a constant frequency.

The clock generation circuit 75 generates a plurality of clock signals CK1 to CK4 based on the clock signal input from the PI circuit 73. For the generation of the clock signals CK1 to CK4, the clock generation circuit 75 uses, for example, a frequency division circuit. The clock generation circuit 75 inputs the generated clock signals CK1 to CK4 to the A/D converter part 40. The number of clock signals CK generated by the clock generation circuit 75 may be suitably varied according to the configuration of the A/D converter part 40.

Based on, for example, the second signal S2 and the first data D1 input from the first equalizer part 50 and the digital value D0 input from the A/D converter part 40, the first control part 80 computes a plurality of tap coefficients $a_{-2}$, $a_{-1}$, $a_0$, $a_1$, and $a_2$ to be used in the first equalizer part 50. The tap coefficient $a_0$ is associated with a center tap used in the first equalizer 50. The tap coefficients $a_{-2}$ and $a_{-1}$ are associated with taps set in the direction of a precursor with reference to the center tap. The tap coefficients $a_1$ and $a_2$ are associated with taps set in the direction of a postcursor with reference to the center tap. The number in subscript appended to the tap coefficient "a" indicates that the larger its absolute value, the farther from the center tap the cursor it is associated with. The first control part 80 supplies the tap coefficients $a_{-2}$, $a_{-1}$, $a_1$, and $a_2$ updated by the computation to the first FFE part 51, and supplies the tap coefficient $a_0$ to the first data comparator part 52.

Based on, for example, the third signal S3 and the data DOUT input from the second equalizer part 60 and the digital value D0 input from the A/D converter part 40, the second control part 90 computes a plurality of tap coefficients $b_{-2}$, $b_{-1}$, $b_0$, $b_1$, and $b_2$ used in the second equalizer part 60. The tap coefficient $b_0$ is associated with a center tap used in the second equalizer 60. The tap coefficients $b_{-2}$ and $b_{-1}$ are associated with taps set in the direction of a precursor with reference to the center tap. The tap coefficients $b_1$ and $b_2$ are associated with taps set in the direction of a postcursor with reference to the center tap. The number in subscript appended to the tap coefficient "b" indicates that the larger its absolute value, the farther from the center tap the cursor it is associated with. The second control part 90 supplies the tap coefficients $b_{-2}$, $b_{-1}$, and $b_2$ to the second FFE part 61, supplies the tap coefficient $b_1$ to the DFE part 62, and supplies the tap coefficient $b_0$ to the second data comparator part 63. Also, the second control part 90 is capable of allowing the first control part 80 to use the tap coefficient $a_1$ of the first equalizer 50 based on the tap coefficient updated by the second equalizer 60. Also, the second control part 90 is capable of calculating a parameter used in adjustment of a tap coefficient using the third signal S3 or the fourth signal S4.

In the above-described receiver circuit 10, the clock control part 70 may allow the phases of the data signals (RCV and /RCV) and the clock signal CK received by the receiver device 4 to be synchronized, through the repetition of adjustment of the phase (timing) of the clock signal. Hereinafter, the repetition of adjustment of the phase of the clock signal is referred to as a "CDR loop". A state in which the data signals and the clock signal CK received by the receiver device 4 are synchronized is also referred to as a "state in which the CDR circuit 71 is locked". The CDR circuit 71, when locked, may send a signal indicating that it is locked to, for example, a first control circuit 80 and a second control circuit 90.

The tap coefficient $a_1$ generated by the second control part 90 may be used for control of the first equalizer 50 via the first control part 80, or supplied to the first equalizer 50 by the second control part 90. The receiver circuit 10 may further include a control part that controls the tap coefficient $a_1$. Each of the first data comparator part 52 and the second data comparator part 63 determines data of the input signal with reference to, for example, at least one reference voltage. A storage unit that buffers the digital value D0 may be provided in the receiver circuit 10 between the A/D converter part 40 and the first equalizer part 50. In this case, the storage unit may store the digital value D0 that may be referred to by the digital signal processor DSP corresponding to the number of cycles of A/D conversion by the A/D converter part 40.

[1-1-3] Configuration of A/D Converter Part 40

Figure 5:
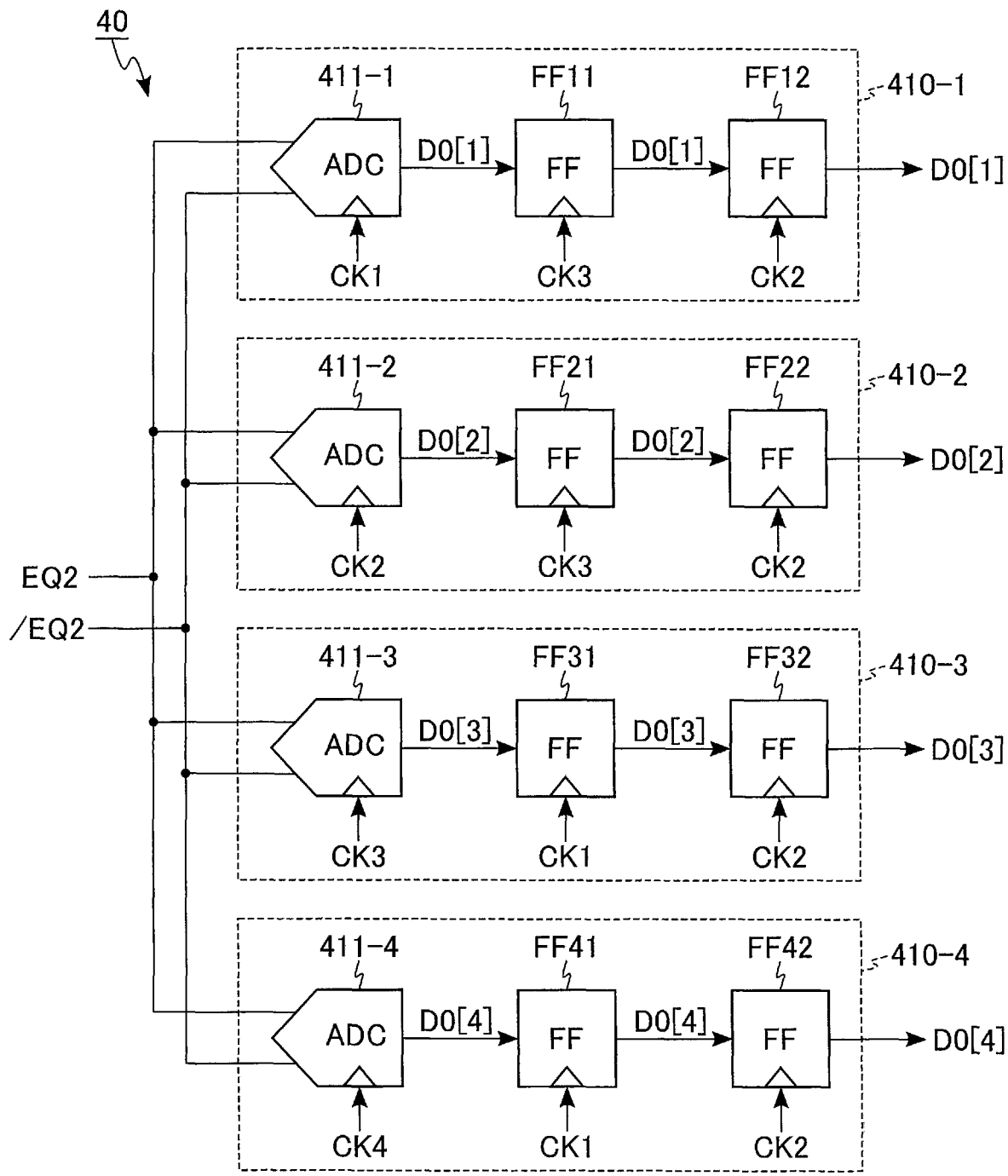
FIG. 5 is a block diagram showing an example of a circuit configuration of an A/D converter part included in the receiver circuit according to the first embodiment.

FIG. 5 is a block diagram showing an example of a configuration of the A/D converter part 40 included in the receiver circuit 10 according to the first embodiment. FIG. 5 illustrates a configuration in which the A/D converter part 40 outputs four digital values D0 based on four types of clock signals CK1 to CK4. As shown in FIG. 5, the A/D converter part 40 includes, for example, conversion parts 410-1, 410-2, 410-3, and 410-4 associated with different phases. Each of the conversion parts 410-1, 410-2, 410-3, and 410-4 includes, for example, an A/D converter (ADC) 411 and two flip-flop circuits FF.

The equalization signals EQ2 and/EQ2 (analog signals) are input to each ADC 411, and A/D conversion is executed based on a difference between the equalization signals EQ2 and/EQ2. The ADCs 411-1, 411-2, 411-3, and 411-4 respectively output digital values D0[1], D0[2], D0[3], and D0[4]. The numeral in brackets appended to "D0" corresponds to a unit interval when an A/D conversion process is performed by the A/D converter part 40. The ADCs 411-1, 411-2, 411-3, and 411-4 respectively operate based on the clock signals CK1, CK2, CK3, and CK4. In the present example, the phases of the clock signals CK1 to CK4 are shifted by 90 degrees. Specifically, the phases of the clock signals CK1, CK2, CK3, and CK4 are 0 degrees, 90 degrees, 180 degrees, and 270 degrees, respectively, with reference to the clock signal CK1.

The flip-flop circuit FF11 of the conversion unit 410-1 operates based on the clock signal CK3, and temporarily stores a digital value D0[1] output from the ADC 411-1. The flip-flop circuit FF12 of the conversion unit 410-1 operates based on the clock signal CK2, and temporarily stores the digital value D0[1] output from the flip-flop circuit FF11. The output from the flip-flop circuit FF12 is output from the A/D converter part 40.

The flip-flop circuit FF21 of the conversion unit 410-2 operates based on the clock signal CK3, and temporarily stores a digital value D0[2] output from the ADC 411-2. The flip-flop circuit FF22 of the conversion unit 410-2 operates based on the clock signal CK2, and temporarily stores the digital value D0[2] output from the flip-flop circuits FF21. The output from the flip-flop circuit FF22 is output from the A/D converter part 40.

The flip-flop circuit FF31 of the conversion unit 410-3 operates based on the clock signal CK1, and temporarily stores a digital value D0[3] output from the ADC 411-3. The flip-flop circuit FF32 of the conversion unit 410-3 operates based on the clock signal CK2, and temporarily stores the digital value D0[3] output from the flip-flop circuit FF31. The output from the flip-flop circuit FF32 is output from the A/D converter part 40.

The flip-flop circuit FF41 of the conversion unit 410-4 operates based on the clock signal CK1, and temporarily stores a digital value D0[4] output from the ADC 411-4. The flip-flop circuit FF42 of the conversion unit 410-4 operates based on the clock signal CK2, and temporarily stores the digital value D0[4] output from the flip-flop circuit FF41. The output from the flip-flop circuit FF42 is output from the A/D converter part 40.

FIG. 6 is a timing chart for illustrating processings of the A/D converter part 40 included in the receiver circuit 10 according to the first embodiment. FIG. 6 shows a flow of an A/D conversion process by the A/D converter part 40 illustrated in FIG. 5. The input signal DIN corresponds to a differential signal of the received signals RCV and /RCV. The notation "A[t]" indicates a magnitude of the input signal DIN (analog signal) at time t. Hereinafter, a description will be given of processing of the A/D converter part 40 with a focus on processing of the conversion unit 410-1 which executes an A/D conversion based on a clock signal CK1.

When a clock signal CK1 rises, the ADC 411-1 starts an A/D conversion of an analog signal A[t] (FIG. 6(1)). After that, during the period until the clock signal CK1 rises next, the ADC 411-1 outputs a digital value D0[t] based on the analog signal A[t] to the flip-flop circuit FF11 (FIG. 6(2)). Thereafter, when a clock signal CK3 rises, the flip-flop circuit FF11 stores the digital value D0[t] input from the ADC 411-1, and outputs it to the flip-flop circuit FF12 (FIG. 6(3)). Thereafter, when the clock signal CK2 rises, the flip-flop circuit FF12 stores the digital value D0[t] input from the flip-flop circuit FF11, and outputs it to an external processing circuit (e.g., the first equalizer 50) (FIG. 6(4)).

Each of the conversion units 410-2 to 410-4 operates similarly to the conversion unit 410-1 except for the difference in combination of the clock signals CK input to the ADC 411 and the two flip-flop circuits FF. Thereby, in the present example, data in the conversion units 410-1 to 410-4 is output to the outside at a timing based on a common clock signal CK2. As a result, the conversion units 410-1 to 410-4 respectively output digital values D0[$t-4*i$], D0[$t+1-4*i$], D0[$t+2-4*i$], and D0[$t+3-4*i$] (where i is an integer) based on clock signals CK input in parallel.

It suffices that the A/D converter part 40 includes at least two ADCs 411. For example, the A/D converter part 40 operates N ADCs 411 (where N is an integer equal to or greater than two) with clock signals CK with phases that are shifted by 360/N degrees. This allows the A/D converter part 40 to execute an analog-to-digital conversion process with a sampling number that is N times larger than that of a single ADC 411.

The first equalizer 50 and the second equalizer 60 of the receiver circuit 10 according to the first embodiment compensate for a signal using digital values D0 of two unit intervals before and after time t (t−2, t−1, t+1, t+2) when a cursor is set at time t. Hereinafter, the tap applied to a unit interval two unit intervals before the set cursor is referred to as "TAPpre2". The tap applied to a unit interval one unit interval before the set cursor is referred to as "TAPpre1". The tap applied to a unit interval one unit interval after the set cursor is referred to as "TAPpost1". The tap applied to a unit interval two unit intervals after the set cursor is referred to as "TAPpost2".

The illustrated analog signals A[t+2], A[t+1], A[t−1], and A[t−2] are respectively associated with TAPpre2, TAPpre1, TAPpost1, and TAPpost2. The tap coefficients $a_{-2}$ and $b_{-2}$ are used in TAPpre2. The tap coefficients $a_{-1}$ and $b_{-1}$ are used in TAPpre1. The tap coefficients $a_0$ and $b_0$ are used in a center tap. The tap coefficients $a_1$ and $b_1$ are used in TAPpost1. The tap coefficients $a_2$ and $b_2$ are used in TAPpost2.

It suffices that each of the first equalizer 50 and the second equalizer 60 utilizes at least TAPpost1. It suffices that the number of taps used in the first equalizer 50 and the second equalizer 60 is at least one, and may be five or greater. The number of TAPpre's and TAPpost's that are used may be either the same or different. It is preferable that the receiver circuit 10 also utilize TAPpre, since the digital value D0 is utilized.

[1-1-4] Configuration of First Equalizer 50

(Configuration of First FFE Part 51)

Figure 7:
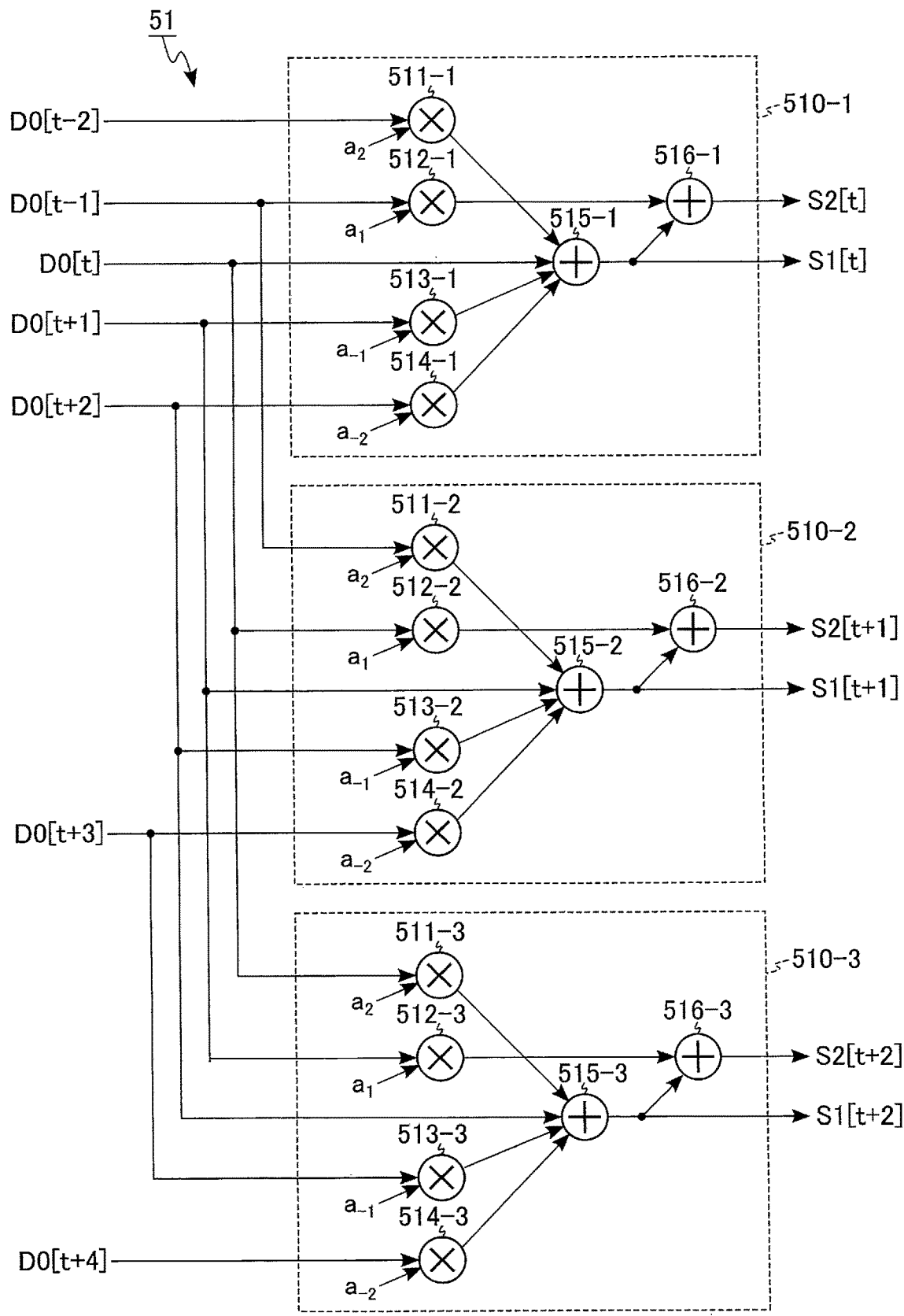
FIG. 7 is a diagram showing an example of a configuration of a first FFE part included in the receiver circuit according to the first embodiment.

FIG. 7 is a diagram showing an example of a configuration of a first FFE part 51 included in the receiver circuit 10 according to the first embodiment. As shown in FIG. 7, the first FFE part 51 according to the first embodiment includes an FFE circuit 510-1, an FFE circuit 510-2, and an FFE circuit 510-3. Each of the FFE circuits 510-1, 510-2, and 510-3 includes multipliers 511, 512, 5'13, and 514, and adders 515 and 516.

Each multiplier 511 corresponds to TAPpost2 in the first FFE part 51. Each multiplier 511 multiplies the input digital value D0 with the tap coefficient $a_2$, and inputs the multiplication result into the adder 515.

Each multiplier 512 corresponds to TAPpost1 in the first FFE part 51. Each multiplier 512 multiplies the input digital value D0 with the tap coefficient $a_1$, and inputs the multiplication result into the adder 516.

Each multiplier 513 corresponds to TAPpre1 in the first FFE part 51. Each multiplier 513 multiplies the input digital value D0 with the tap coefficient $a_{-1}$, and inputs the multiplication result into the adder 515.

Each multiplier 514 corresponds to TAPpre2 in the first FFE part 51. Each multiplier 514 multiplies the input digital value D0 with the tap coefficient $a_{-2}$, and inputs the multiplication result into an adder 515.

Each adder 515 corresponds to a center tap in the first FFE part 51. Each adder 515 adds a plurality of multiplication results respectively input from the multipliers 511, 513, and 514 associated therewith and the input digital value D0, and outputs the addition result as a first signal S1.

Each adder 516 adds the multiplication result input from the multiplier 512 associated therewith and the first signal S1 output from the adder 515 associated therewith, and outputs the addition result as a second signal S2.

That is, the first signal S1 corresponds to the sum of the outputs of the taps excluding TAPpost1 among the plurality of taps handled by the first FFE part 51. The second signal S2 corresponds to the sum of the outputs of all the taps handled by the first FFE part 51.

In the present example, digital values D0[$t$], D0[$t$+1], and D0[$t$+2] are respectively input to the respective center taps of the FFE circuits 510-1, 510-2, and 510-3. In this case, digital values D0[$t$–2], D0[$t$–1], D0[$t$+1], and D0[$t$+2] are respectively input to the multipliers 511-1, 512-1, 513-1, and 514-1 of the FFE circuit 510-1. Digital values D0[$t$–1], D0[$t$], D0[$t$+2], and D0[$t$+3] are respectively input to the multipliers 511-2, 512-2, 513-2, and 514-2 of the FFE circuit 510-2. Digital values D0[$t$], D0[$t$+1], D0[$t$+3], and D0[$t$+4] are respectively input to the multipliers 511-3, 512-3, 513-3, and 514-3 of the FFE circuit 510-3. Similarly, digital values D0 of one-unit interval shifted unit intervals of time when the A/D conversion process is performed by the A/D converter part 40 are respectively input to the FFE circuits 510 included in the first FFE part 51.

Thereby, in the first FFE part 51 of the first embodiment, the FFE circuit 510-1 outputs a first signal S1[$t$] and a second signal S2[$t$], the FFE circuit 510-2 outputs a first signal S1[$t$+1] and a second signal S2[$t$+1], the FFE circuit 510-3 outputs a first signal S1[$t$+2] and a second signal S2[$t$+2], . . . , and the FFE circuit 510-N outputs a first signal S1[$t$+(N–1)] and a second signal S2[$t$+(N–1)]. The first FFE part 51 included in the first equalizer 50 may be referred to as an "FFE for CDR".

(Configuration of First Data Comparator Part 52)

Figure 8:
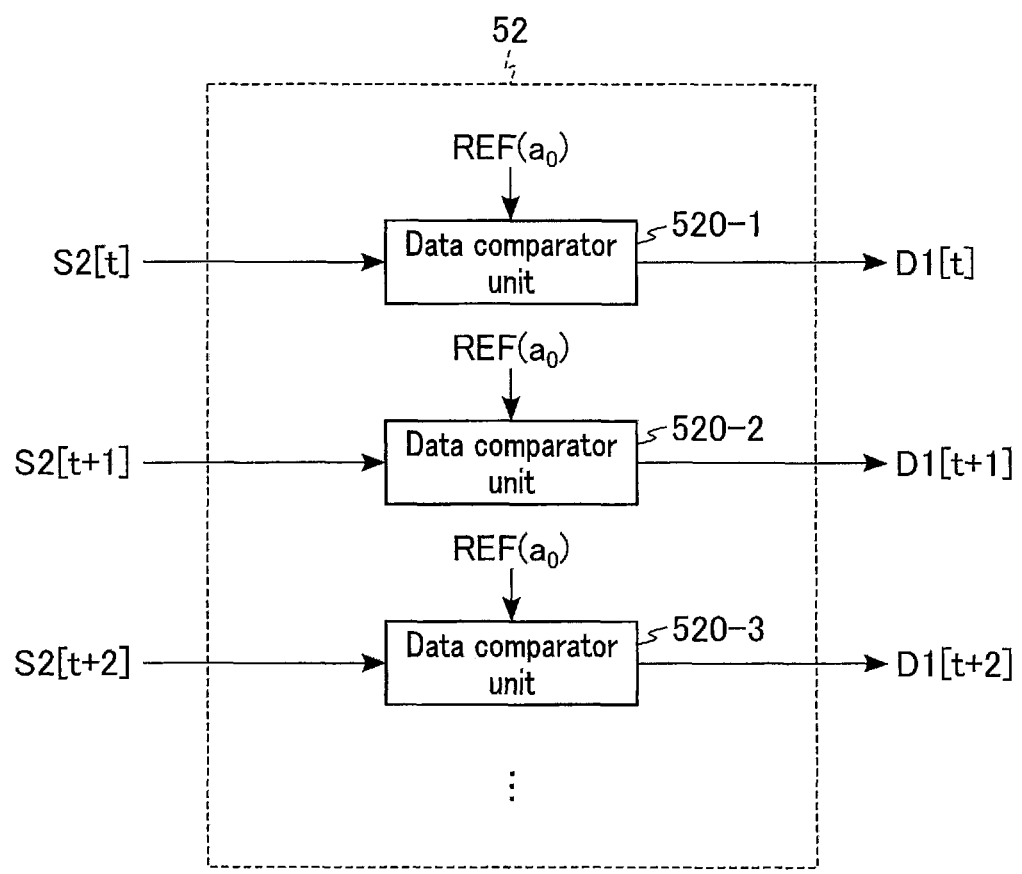
FIG. 8 is a diagram showing an example of a configuration of a first data comparator part included in the receiver circuit according to the first embodiment.

FIG. 8 is a diagram showing an example of a configuration of the first data comparator part 52 included in the receiver circuit 10 according to the first embodiment. FIG. 8 illustrates a configuration associated with the FFE circuits 510-1 to 510-3 in the first data comparator part 52. As shown in FIG. 8, the first data comparator part 52 includes data comparator units 520-1, 520-2, and 520-3.

Each of the data comparator units 520-1, 520-2, and 520-3 respectively determines data corresponding to the second signal S2 output from the FFE circuits 510-1, 510-2, and 510-3. The timing at which the data comparator unit 520 determines data is based on, for example, a clock signal separately input to the data comparator unit 520. Each data comparator unit 520 uses REF($a_0$) as a reference for data comparator. REF($a_0$) is, for example, an multiplied value of a particular value and the tap coefficient $a_0$.

The data comparator unit 520-1 outputs the determination result as first data D1[$t$]. The data comparator unit 630-2 outputs the determination result as first data D1[$t$+1]. The data comparator unit 630-3 outputs the determination result as first data D1[$t$+2]. Similarly, the data comparator unit 520 included in the first data comparator part 52 determines data of the second signal S2 input from the FFE circuit 510 associated therewith, and outputs first data D1.

[1-1-5] Configuration of Second Equalizer 60

(Configuration of Second FFE Part 61)

Figure 9:
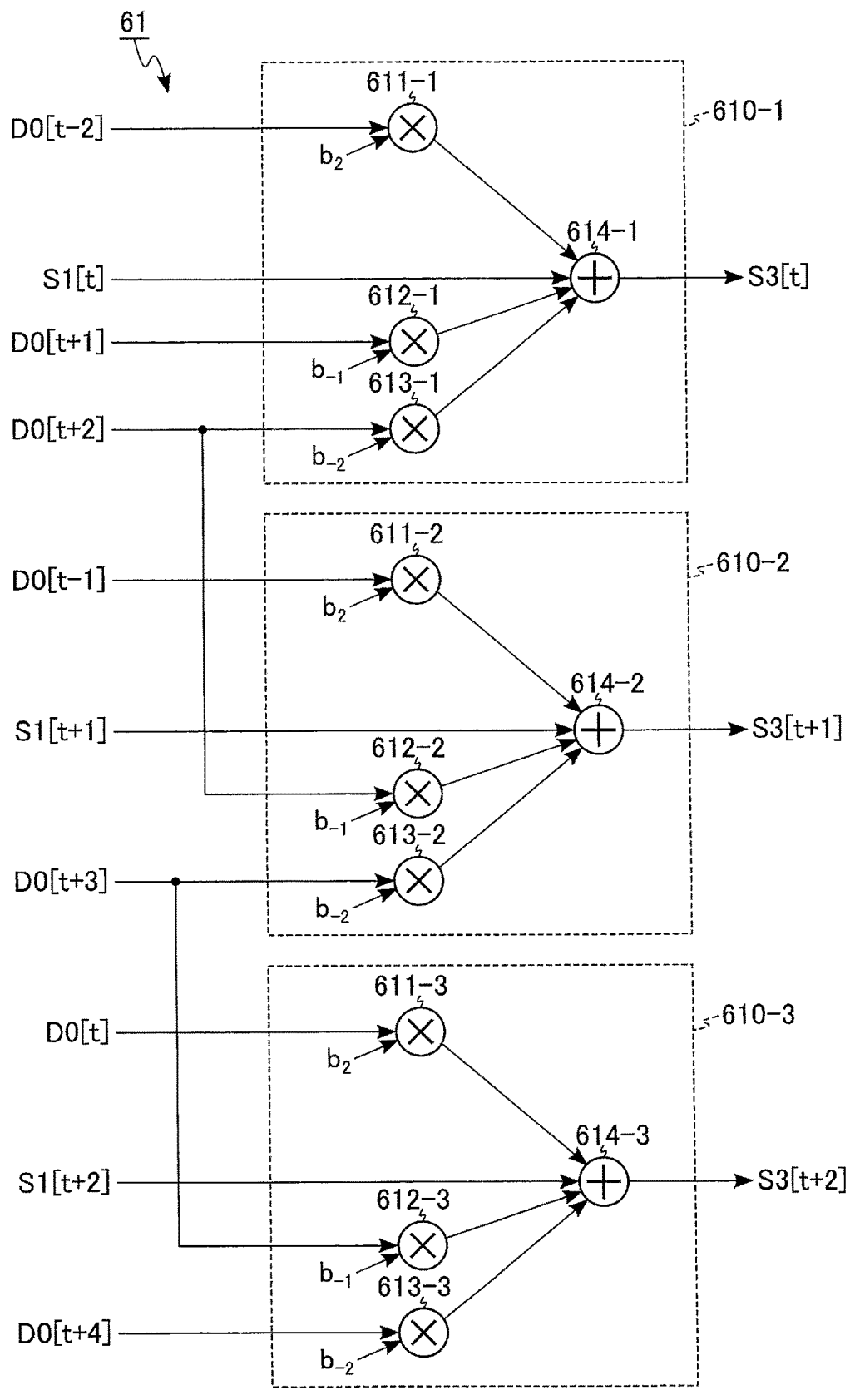
FIG. 9 is a diagram showing an example of a configuration of a second FFE part included in the receiver circuit according to the first embodiment.

FIG. 9 is a diagram showing an example of a configuration of a second FFE part 61 included in the receiver circuit 10 according to the first embodiment. As shown in FIG. 9, the second FFE part 61 according to the first embodiment includes an FFE circuit 610-1, an FFE circuit 610-2, and an FFE circuit 610-3. Each of the FFE circuits 610-1, 610-2, and 610-3 includes multipliers 611, 612, and 613, and an adder 614.

Each multiplier 611 corresponds to TAPpost2 in the second FFE part 61. Each multiplier 611 multiplies the input digital value D0 with the tap coefficient $b_2$, and inputs the multiplication result into the adder 614.

Each multiplier 612 corresponds to TAPpre1 in the second FFE part 61. Each multiplier 612 multiplies the input digital value D0 with the tap coefficient $b_{-1}$, and inputs the multiplication result into the adder 614.

Each multiplier 613 corresponds to TAPpre2 in the second FFE part 61. Each multiplier 613 multiplies the input digital value D0 with the tap coefficient $b_{-2}$, and inputs the multiplication result into the adder 614.

Each adder 614 corresponds to a center tap in the second FFE part 61. Each adder 614 adds a plurality of multiplication results input from the multipliers 611, 612, and 613 associated therewith, and the input first signal S1. Each adder 614 outputs the addition result as a third signal S3. That is, the third signal S3 corresponds to the sum of outputs of the taps excluding TAPpost1 among the plurality of taps handled by the second FFE part 61.

In the present example, first signals S1[$t$], S1[$t$+1], and S1[$t$+2] are respectively input to the respective center taps of the FFE circuits 610-1, 610-2, and 610-3. In this case, digital values D0[$t$–2], D0[$t$+1], and D0[$t$+2] are input to the multipliers 611-1, 612-1, and 613-1 of the FFE circuit 610-1. Digital values D0[$t$–1], D0[$t$+2], and D0[$t$+3] are input to the multipliers 611-2, 612-2, and 613-2 of the FFE circuit 610-2. Digital values D0[$t$], D0[$t$+3], and D0[$t$+4] are respectively input to the multipliers 611-3, 612-3, and 613-3 of the FFE circuit 610-3. Similarly, first signals S1 of one-unit interval shifted unit intervals of time when the A/D conversion process is performed by the A/D converter part 40 are input to the FFE circuits 610 included in the second FFE part 61.

Thereby, in the second FFE part 61 of the first embodiment, the FFE circuit 610-1 outputs a third signal S3[$t$], the FFE circuit 610-2 outputs a third signal S3[$t$+1], the FFE circuit 610-3 outputs a third signal S3[$t$+2], . . . , and the FFE circuit 610-N outputs a third signal S3[$t$+(N–1)]. The second FFE part 61 included in the second equalizer 60 may be referred to as an "FFE for data".

(Configuration of DFE Part 62 and Second Data Comparator Part 63)

FIG. 10 is a diagram showing an example of a configuration of the DFE part 62 and the second data comparator part 63 included in the receiver circuit 10 according to the first embodiment. FIG. 10 illustrates a case where the DFE part 62 and the second data comparator part 63 configure an Unroll DFE to which four kinds of third signals S3 are input. As shown in FIG. 10, the DFE part 62 includes DFE circuits 620-1, 620-2, 620-3, and 620-4. The second data comparator part 63 includes data comparator units 630-1, 630-2, 630-3, and 630-4, and a flip-flop circuit 631. The DFE circuits 620-1, 620-2, 620-3, and 620-4 are respectively associated with the data comparator units 630-1, 630-2, 630-3, and 630-4.

The DFE circuit 620-1 includes adder 621-1 and 622-1, and a multiplexer 623-1. The DFE circuit 620-2 includes adder 621-2 and 622-2, and a multiplexer 623-2. The DFE circuit 620-3 includes adder 621-3 and 622-3, and a multiplexer 623-3. The DFE circuit 620-4 includes adder 621-4 and 622-4, and a multiplexer 623-4. The third signal S3 assigned to the DFE circuit 620 is input to each of the adders 621 and 622. Each adder 621 adds the input third signal S3 and "+$b_1$" obtained by multipling "+1" with the tap coefficient $b_1$ and inputs the addition result to the multiplexer 623. Each adder 622 adds the input third signal S3 and "−$b_1$" obtained by multipling "−1" with the tap coefficient $b_1$ and inputs the addition result to the multiplexer 623. The multiplexer 623 outputs one of the input addition results as a fourth signal S4, based on the data input from the second data comparator part 63.

The data comparator units 630-1, 630-2, 630-3, and 630-4 determine data corresponding to the fourth signal S4 output from the DFE circuits 620-1, 620-2, 620-3, and 620-4. The timing at which the data comparator unit 630 determines data is based on, for example, a clock signal separately input to the data comparator unit 630. Each data comparator unit 630 uses a reference value REF($b_0$) as a reference for data comparator. The REF($b_0$) is, for example, an integral value of a particular value and a tap coefficient $b_0$.

The data comparator unit 630-1 outputs the determination result to the multiplexer 623-2 as data DOUT[1], and outputs it to the outside. The data comparator unit 630-2 inputs the determination result as data DOUT[2] to the multiplexer 623-3, and outputs it to the outside. The data comparator unit 630-3 inputs the determination result as data DOUT[3] to the multiplexer 623-4, and outputs it to the outside. The data comparator unit 630-4 inputs the determination result as data DOUT[4] to the flip-flop circuit 631, and outputs it to the outside. The flip-flop circuit 631 stores the data DOUT[4] output in the previous cycle, and inputs the stored data DOUT[4] to the multiplexer 623-1 in the next cycle.

That is, in the present example, the DFE circuit 620-1 outputs one of the outputs from the adders 621 and 622 as a fourth signal S4[1] based on the determination result (data) of the previous fourth signal S4[4]. The DFE circuit 620-2 outputs one of the outputs from the adders 621 and 622 as a fourth signal S4[2] based on the determination result (data) of the previous fourth signal S4[1]. The DFE circuit 620-3 outputs one of the outputs from the adders 621 and 622 as a fourth signal S4[3] based on the determination result (data) of the previous fourth signal S4[2]. The DFE circuit 620-4 outputs one of the outputs from the adders 621 and 622 as a fourth signal S4[4] based on the determination result (data) of the previous fourth signal S4[3].

The DFE part 62 and the second data comparator part 63 described above may have other configurations. For example, the DFE part 62 and the second data comparator part 63 may process third signals S3 of five or more inputs by including five or more sets of DFE circuits 620 and data comparator units 630. When the used DFE part 62 is of an Unroll type, it suffices that at least the determination result based on the output from the lastly arranged DFE circuit 620 is input to the multiplexer 623 of the DFE circuit 620 arranged first. When multiple-bit data (of four or more values) is assigned to a single pulse signal received by the receiver circuit 10, the DFE circuit 620 may have a number of adders corresponding to the value to be handled. A certain tap coefficient is assigned to such adders. The multiplexer 623 outputs an output from one of the adders as a fourth signal S4 based on the input of the previous four-value data.

[1-1-6] Configuration of DFE Part 62 and Second Control Part 90

Figure 11:
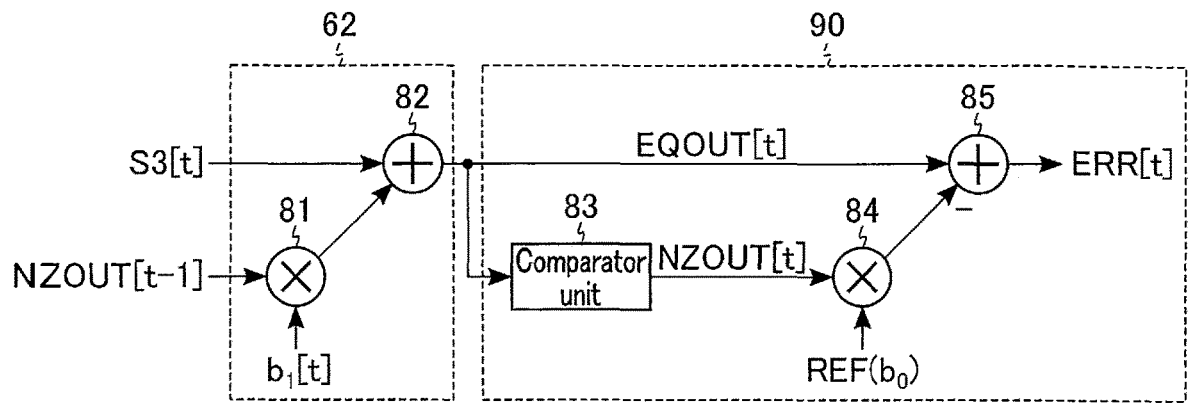
FIG. 11 is a diagram showing an example of a configuration of the DFE part and the second control part included in the receiver circuit according to the first embodiment.

FIG. 11 is a diagram showing an example of a configuration of the DFE part 62 and the second control part 90 included in the receiver circuit 10 according to the first embodiment. As shown in FIG. 11, the DFE part 62 further includes, for example, an multiplier 81 and an adder 82. The second control part 90 includes, for example, a comparator unit 83, an multiplier 84, and an adder 85.

The multiplier 81 multiplies data NZOUT[t−1] with the tap coefficient $b_1$, and inputs the multiplication result to the adder 82. In the first equalizer 50, for example, the data NZOUT[t−1] is, for example, the determination result associated with time t−1, and corresponds to, for example, the data DOUT. That is, the multiplier 81 outputs data NZOUT[t−1] at a time t−1 one time before, and outputs an multiplication result with the tap coefficient $b_1$ at the current time t.

The adder 82 adds the first signal S3[$t$] with the addition result input from the multiplier 81, and outputs it to each of the comparator unit 83 and the adder 85. The addition result by the adder 82 corresponds to the equalization result EQOUT[t] of the first signal S3[$t$].

The comparator unit 83 determines data of the input equalization result EQOUT[t], and outputs the determination result as data NZOUT[t]. The data NZOUT[t] is input to the multiplier 84.

The multiplier 84 multiplies the data NZOUT[t] with a reference value REF($b_0$), and inputs the multiplication result to the adder 85.

The adder 85 adds the equalization result EQOUT[t] and a value obtained by multiplying the multiplication result input from the multiplier 84 with (−1). In other words, the adder 85 subtracts, from the equalization result EQOUT[t], the multiplication result input from the multiplier 84. The addition result of the adder 85 is output as a differential ERR[t]. The second control part 90 may adjust the parameters based on the differential ERR[t].

For example, the tap coefficient used in TAPpost1 is updated by computing "$b_1[t+1]=b_1[t]-LR*sign(NZOUT[t-1])*DIR$". The "LR (Learning Rate)" denotes an adjustment amount of a parameter by a single parameter adjustment sequence. The "LR" may be fixed or varied during the process of adjustment of the tap coefficient, or may be varied according to the parameter. The "sign" is a specific sign, and its value changes according to the substituted numerical value. The "DIR" denotes an adjustment direction, and takes either of the numerical values "+1" and "−1".

The tap coefficient used in TAPpost2 is updated by computing "$b_2[t+1]=b_2[t]-LR*sign(Do[t-2])*sign(ERR)$". The reference value REF($b_0$) used for data comparator is also updated by computing "$REF[t+1]=REF[t]-LR*sign(NZOUT[t])*sign(ERR)*(-1)$". The other tap coefficients can be calculated in a similar manner. In this manner, the update amount relative to a parameter to be updated may be calculated based on a difference (ERR) between the compensated value (EQOUT) and an expected value (NZOUT) of the determination result, and a value to be multiplied by parameters (a tap coefficient, a reference value REF, etc.) to be updated. This computation result uses a sign. Such a computation process using a sign is referred to as a sign-sign algorithm.

Figure 12:
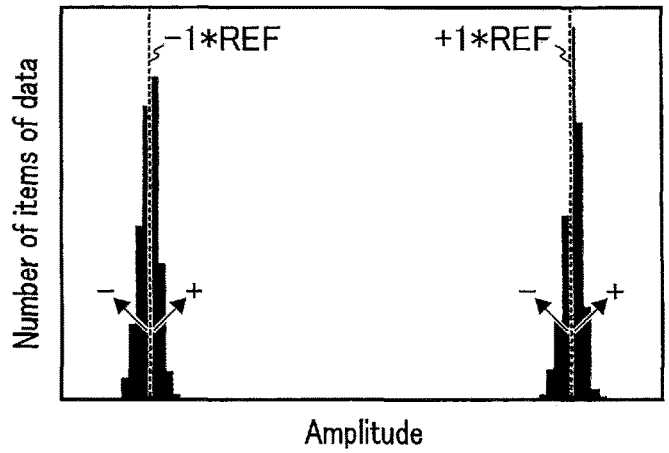
FIG. 12 is a histogram for illustrating processings of the DFE part and the second control part included in the receiver circuit according to the first embodiment.

FIG. 12 is a histogram for illustrating the processings of the DFE part 62 and the second control part 90 included in the receiver circuit 10 according to the first embodiment. In FIG. 12, the lateral axis denotes an amplitude of the equalization result EQOUT at a phase of a two-value signal, and the vertical axis denotes the number of items of data detected at the phase. As shown in FIG. 12, the amplitude value of a two-value signal is distributed, for example, in the vicinity of each of a portion of −1*REF and a portion of +1*REF.

The parameter adjustment direction (DIR) is determined according to whether the associated equalization result EQOUT exceeds −1*REF (+) or does not exceed −1*REF (−) when the data NZOUT[t] is "−1". The adjustment direction (DIR) is determined according to whether the associated equalization result EQOUT exceeds +1*REF (+) or does not exceed +1*REF (−) when the data NZOUT[t] is "+1". That is, the second control part 90 determines the parameter adjustment direction according to whether the difference ERR[t] is positive or negative.

A description has been given above of an example of a method in which the second control part 90 adjusts the parameters of the second equalizer 60; however, the first control part 80 is capable of adjusting (updating) the parameter of the first equalizer 50, similarly to the second control part 90. That is, the first control part 80 is capable of using a sign-sign algorithm, similarly to the second control part 90. Hereinafter, the process of repeating adjustment and updating of the parameters of the first equalizer 50 and the second equalizer 60 is referred to as an "LMS loop".

[1-2] Operation

Figure 13:
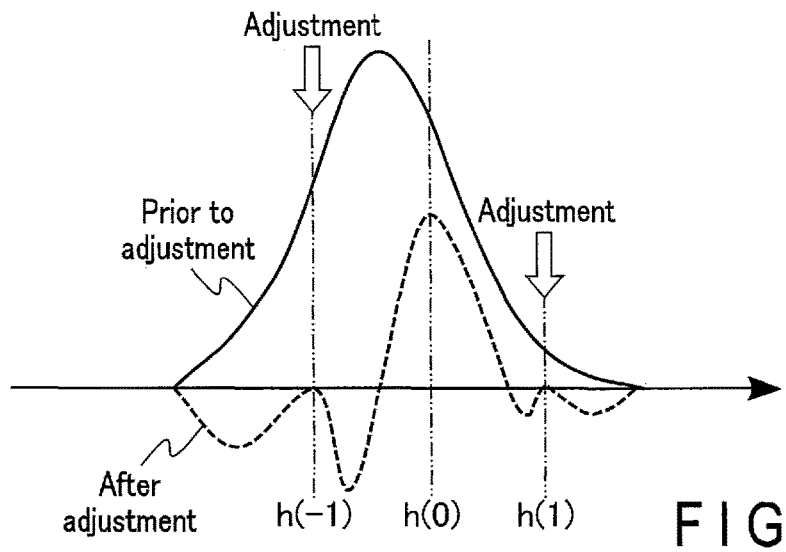
FIG. 13 is a schematic diagram for illustrating an overview of a timing adjustment method of a clock signal in the receiver circuit according to the first embodiment.

FIG. 13 is a schematic diagram for illustrating an overview of an operation of adjusting the phase of a clock signal CK of the receiver circuit 10 according to the first embodiment, and shows a portion corresponding to a single pulse signal relating to adjustment of a clock signal CK. h(0) denotes a center cursor, and is associated with the center tap. h(−1) denotes a precursor of a unit interval that is one unit interval before h(0), and is associated with TAPpre1. h(+1) denotes a post cursor of a unit interval that is one unit interval after h(0), and is associated with TAPpost1.

The baud rate CDR locks the clock signal CK at the point where, for example, h(−1) and h(1) are balanced. The baud rate CDR adjusts the phase in such a manner, for example, that the formula "Early value−Late value=0" is satisfied. The "Early value" corresponds to the intensity of a signal at h(−1). The "Late value" corresponds to the intensity of a signal at h(1). When, for example, the formula "Early value−Late value=0" is satisfied by a CDR loop, the clock signal CK is locked.

In an analog receiver circuit, when h(1) is compensated for by a DFE circuit, a shift in lock position may occur. Thus, in an analog receiver circuit, considerations have been made to adjust the phase by adjusting the lock position through the adjustment of an Early/Late rate and adjusting the phase through addition of an offset to a difference between the Early value and the Late value (offset-adjustment CDR). Examples of the method of adjusting the Early/Late rate include appropriately setting the UP/DN ratio. The UP/DN ratio is a particular ratio applied to the intensity of each of h(−1) and h(1). Through the appropriate adjustment of the UP/DN ratio, the amplitude of the eye pattern may increase.

However, the FFE of the CDR loop is adjusted in such a manner, for example, that h(−1) and h(1) become zero. Accordingly, as shown in FIG. 13, even when the clock control part 70 attempts to shift the phase with respect to the signal waveform prior to the adjustment by making the Early/Late rate unbalanced, h(−1) and h(1) are adjusted to zero by the LMS loop as in the signal waveform after the adjustment. As a result, there is a possibility that the phase of the clock signal CK will not move, depending on the conditions. The offset-adjustment CDR is capable of adjusting the phase if the signal waveform has peaks and troughs, but the range of adjustment of the phase falls within the range of the peaks and troughs and is thus small.

In an FFE circuit used for a CDR loop, since compensation is performed by the FFE circuit and the DFE circuit on the data side, TAPpost1 may be omitted. However, it is preferable that the portion of h(1) which can be a cause of intersymbol interference (ISI) be adjusted. The ISI corresponds to overlapping of waveforms in adjacent unit intervals with individual items of data. Through suppression of the ISI, it is possible to decrease the difficulty for the receiver circuit 10 to decode information contained in the received signals RCV and /RCV.

Accordingly, in the receiver circuit 10 according to the first embodiment, TAPpost1 is provided in the first FFE part 51 for CDR. The receiver circuit 10 executes an LMS loop other than h(1) (i.e., TAPpost1 other than the first FFE part 51), and updates TAPpost1 at a timing independent from the LMS loop. Hereinafter, a description will be given of a first parameter adjusting operation and a second parameter adjusting operation related to timing adjustment (phase adjustment) of a clock signal at the receiver circuit 10 according to the first embodiment and compensation processing of received signals RCV and /RCV. The operations to be described below are controlled by the clock control part 70, the first control part 80, the second control part 90, etc. in the receiver circuit 10. The first parameter adjusting operation and the second parameter adjusting operation may be executed in parallel.

[1-2-1] First Parameter Adjusting Operation

FIG. 14 is a flowchart showing an example of a first parameter adjusting operation of the receiver circuit 10 according to the first embodiment. The first parameter adjusting operation relates to, for example, adjustment of tap coefficients $a_{-2}$, $a_{-1}$, $a_0$, and $a_2$ used in the first equalizer 50. Hereinafter, a description will be given of a first parameter adjusting operation with reference to FIG. 14.

The receiver circuit 10 starts a first parameter adjusting operation in response to, for example, an instruction from the CPU 11 (START).

The receiver circuit 10 initializes a parameter P (ST10). The parameter P at ST10 corresponds to, for example, each of the tap coefficients $a_{-2}$, $a_{-1}$, $a_0$, and $a_2$ used in the first equalizer 50. That is, in the processing of ST10, each of the tap coefficients $a_{-2}$, $a_{-1}$, $a_0$, and $a_2$ is initialized.

Subsequently, the receiver circuit 10 computes an output Y based on an input X (ST11). The input X at ST11 corresponds to, for example, a digital value D0 input to the first FFE part 51. The output Y at ST11 corresponds to, for example, the first signal S1 output from the first FFE part 51. Specifically, in the processing of ST11, the FFE circuit 510 executes, for example, the processing described with reference to FIG. 7 using the tap coefficients $a_{-2}$, $a_{-1}$, $a_0$, $a_1$ and $a_2$.

Subsequently, the receiver circuit 10 updates the parameter P based on the input X, the output Y, and an expected value Yexpect of the output Y (ST12). The expected value Yexpect of the output Y at ST12 corresponds to the value calculated using the first data D1 output from the first data comparator part 52. The processing at ST12 is similar to, for example, the processing described with reference to FIGS. 11 and 12. Specifically, since the multiplier 511-1 computes $a_2*D0[t-2]$, for example, the receiver circuit 10 executes the processing "$a_2[t+1]=a_2[t]-LR*sign(D0[t-2])*sign(Y-Yexpect)$". The other taps can be similarly processed.

Subsequently, the receiver circuit 10 confirms whether the adjustment of the parameter P has been completed or not (ST13). Whether adjustment of the parameter P has been completed or not may be determined by the first control part 80, or may be determined based on the CDR circuit 71 of the clock control part 70 having been locked.

If adjustment of the parameter P has not been completed (NO at ST13), the receiver circuit 10 proceeds with the processing at ST11. That is, the receiver circuit 10 executes adjustment of the parameter P at ST11 and ST12 again.

If the adjustment of the parameter P has been completed (YES in ST13), the receiver circuit 10 ends the first parameter adjusting operation (END).

[1-2-2] Second Parameter Adjusting Operation

FIG. 15 is a flowchart showing an example of a second parameter adjusting operation of the receiver circuit 10 according to the first embodiment. The second parameter adjusting operation relates to adjustment of each of the tap coefficients $b_{-2}$, $b_{-1}$, $b_0$, $b_1$, and $b_2$ used in the second equalizer 60, and adjustment of the tap coefficient $a_1$ used in the first equalizer 50. Hereinafter, a description will be given of a second parameter adjusting operation according to the first embodiment, with reference to FIG. 15.

The receiver circuit 10 starts a second parameter adjusting operation in response to, for example, an instruction from the CPU 11 (START).

The receiver circuit 10 initializes a parameter P and a timer T_cur (ST20). The parameter P at ST20 corresponds to, for example, the tap coefficients $b_{-2}$, $b_{-1}$, $b_0$, $b_1$, and $b_2$ used in the second equalizer 60, and the tap coefficient $a_1$ used in the first equalizer 50. That is, in the processing of ST20, each of the tap coefficients $b_{-2}$, $b_{-1}$, $b_0$, $b_1$, $b_2$, and $a_1$ is initialized. The timer T_cur is included in, for example, the second control part 90. It suffices that the timer T_cur is included at least in the receiver device 4.

Subsequently, the receiver circuit 10 computes an output Y based on an input X (ST21). An input X at ST21 corresponds to, for example, a first signal S1 input to the second FFE part 61 and a third signal S3 input to the DFE part 62. The output Y at ST21 corresponds to, for example, a fourth signal S4 output from the DFE part 62. Specifically, in the processing of ST21, the FFE circuit 610 executes the processing described with reference to FIG. 9, for example, using the tap coefficients $b_{-2}$, $b_{-1}$, $b_0$, and $b_2$, and the DFE circuit 620 executes the processing described with reference to FIG. 10, for example, using the tap coefficient $b_1$.

Subsequently, the receiver circuit 10 updates the parameter P based on the input X, the output Y, and the expected value Yexpect of the output Y (ST22). The expected value Yexpect of the output Y at ST22 corresponds to, for example, the value calculated using the data DOUT output from the second data comparator part 63. The processing at ST22 corresponds to, for example, the processing described with reference to FIGS. 11 and 12. That is, the receiver circuit 10 executes the processing "$P[t+1]=P[t]-LR*sign(X)*sign(Y-Yexpect)$". Specifically, since the multiplier 81 computes $b_1*NZOUT[t-1]$, the receiver circuit 10 executes the processing "$b_1[t+1]=b_1[t]-LR*sign(NZOUT[t-1])*sign(Y-Yexpect)$". The other taps can be similarly processed.

Subsequently, the receiver circuit 10 confirms whether "T_cur>=T_wait" is satisfied (ST23). T_wait is a time at which a cycle in which the processing of ST25 to be described later is executed is determined.

If "T_cur>=T_wait" is not satisfied (NO in ST23), the receiver circuit 10 proceeds with the processing at ST24. In the processing at ST24, the receiver circuit 10 executes the processing "T_cur=T_cur+1". That is, the receiver circuit 10 increments the numerical value of the timer T_cur.

Subsequent to the processing at ST24, the receiver circuit 10 proceeds with the processing at ST21. That is, the receiver circuit 10 executes adjustment of the parameter P at ST21 and ST22 again.

If "T_cur>=T_wait" is satisfied (YES in ST23), the receiver circuit 10 proceeds with the processing at ST25. In the processing at ST25, the receiver circuit 10 executes the processing "$a_1=b_1$" (ST25). That is, the value of the tap coefficient $b_1$ updated by the second equalizer 60 is transferred onto the tap coefficient $a_1$ used in the first equalizer 50.

Subsequent to the processing at ST25, the receiver circuit 10 executes the processing "T_cur=0" (ST26). That is, the receiver circuit 10 resets the timer T_cur. The steps ST25 and ST26 may be executed in reverse order or in parallel.

Subsequent to the processing at ST26, the receiver circuit 10 confirms whether the adjustment of the parameter P has been completed (ST27). Whether adjustment of the parameter P has been completed or not may be determined by the second control part 90, or may be determined based on the CDR circuit 71 of the clock control part 70 having been locked.

If adjustment of the parameter P has not been completed (NO at ST27), the receiver circuit 10 proceeds with the processing at ST21. That is, the receiver circuit 10 executes again the adjustment of the parameter P at ST21 and ST22 and the updating of the parameter of the tap coefficient $a_1$ at a particular cycle.

If the adjustment of the parameter P has been completed (YES in ST27), the receiver circuit 10 ends the second parameter adjusting operation (END).

[1-2-3] Simulation Results

Figure 16:
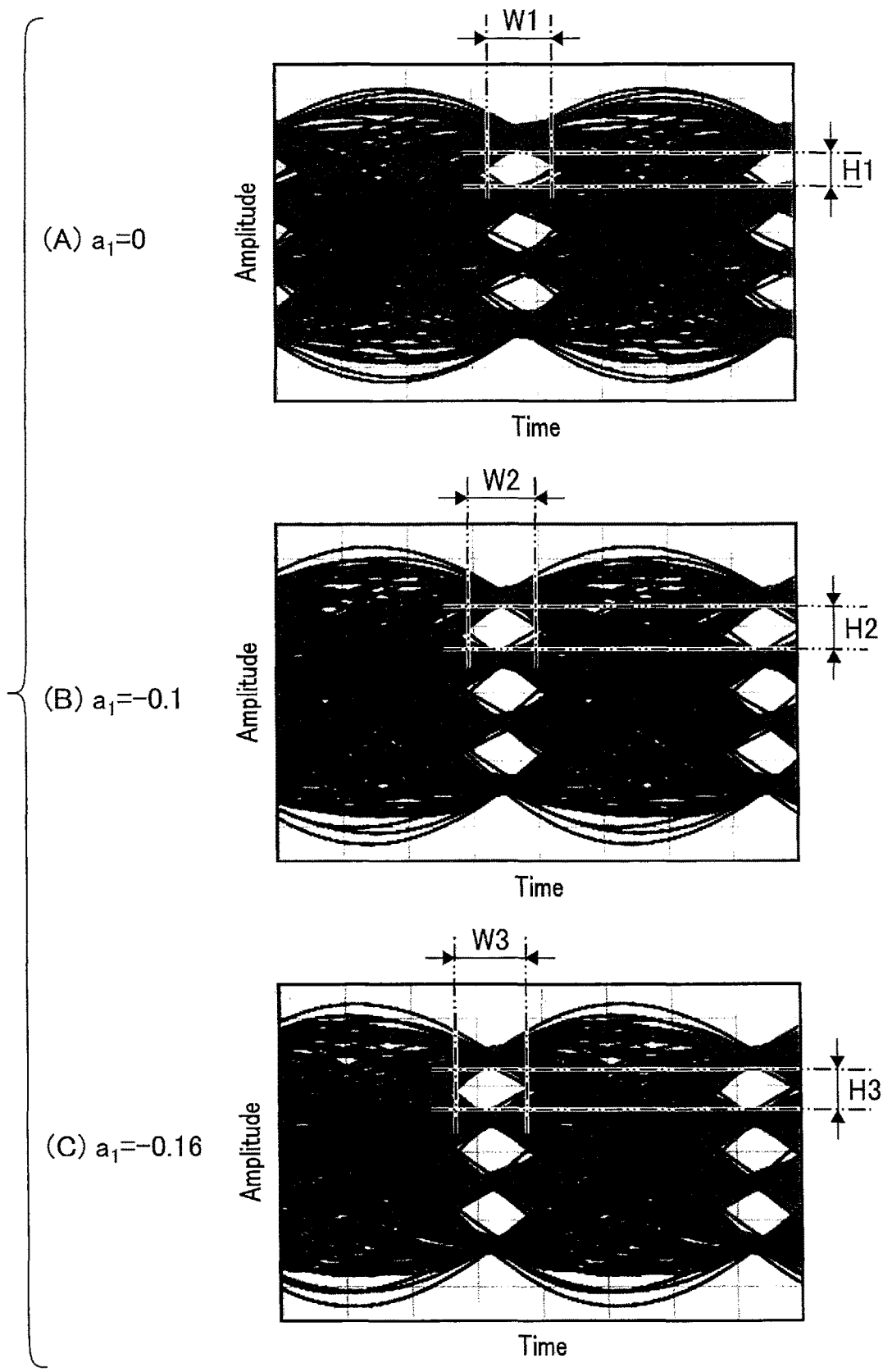
FIG. 16 is a schematic diagram showing an example of changes in eye pattern in the second parameter adjusting operation of the receiver circuit according to the first embodiment.

FIG. 16 is a schematic diagram showing an example of changes in eye pattern in a second parameter adjusting operation of the receiver circuit 10 according to the first embodiment, in which eye patterns of a four-value signal are illustrated. In FIG. 16, the lateral axis of each eye pattern denotes time (phase), and the vertical axis of each eye pattern denotes an amplitude of the signal. In (A), (B) and (C) of FIG. 16, changes in the tap coefficient $a_1$ are arranged in chronological order in accordance with advancement of the second parameter adjusting operation.

As shown in FIG. 16, an opening height H2 of an eye pattern after adjustment ($a_1=-0.1$) and an opening height H3 of an eye pattern after adjustment ($a_1=-0.16$) are higher than an opening height H1 of an eye pattern prior to the adjustment ($a_1=0$). Also, an opening width W2 of an eye pattern after adjustment ($a_1=-0.1$) and an opening width W3 of an eye pattern after adjustment ($a_1=-0.16$) are higher than an opening width W1 of an eye pattern prior to the adjustment ($a_1=0$). That is, as the tap coefficient $a_1$ is further adjusted in accordance with the advancement of the second parameter adjusting operation, the opening portion of the eye pattern increases.

Also, a comparison between the eye pattern of $a_1=0$ and the eye pattern of $a_1=-0.1$ shows that the phase of the opening portion of the eye pattern has been changed. Similarly, a comparison between the eye pattern of $a_1=-0.1$ and the eye pattern of $a_1=-0.16$ shows that the phase of the opening portion of the eye pattern has been changed. In this manner, the second parameter adjusting operation is capable of achieving both the adjustment of the tap coefficient $a_1$ of TAPpost1 and the adjustment of the lock position of the CDR loop.

Figure 17:
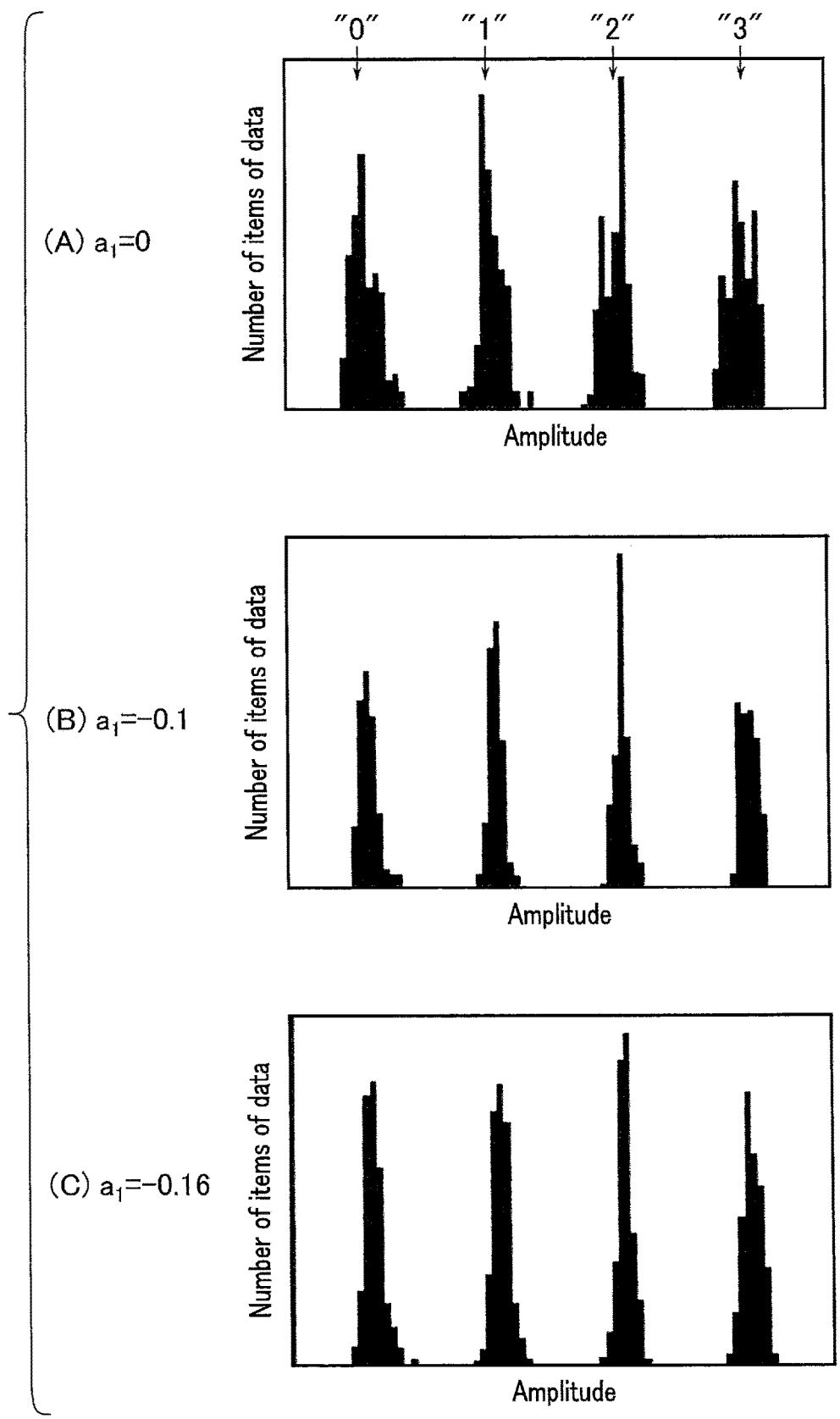
FIG. 17 is a histogram showing an example of changes in data distribution in the second parameter adjusting operation by the receiver circuit according to the first embodiment.

FIG. 17 is a histogram showing an example of changes in data distribution in the second parameter adjusting operation by the receiver circuit 10 according to the first embodiment. In FIG. 17, the lateral axis of each histogram denotes an amplitude of an equalization result EQOUT at a phase of a four-value signal, and the vertical axis of each histogram denotes the number of items of data detected at the phase. The (A), (B) and (C) of FIG. 17 respectively correspond to the states of (A), (B) and (C) shown in FIG. 16.

As shown in FIG. 17, the amplitude value of a four-value signal is distributed in the vicinity of, for example, a "0" data portion, a "1" data portion, a "2" data portion, and a "3" data portion. A comparison between the data distribution of $a_1=0$ and the data distribution of $a_1=-0.1$ shows that variation in amplitude in each item of data is suppressed. Also, a comparison between the data distribution of $a_1=-0.1$ and the data distribution of $a_1=-0.16$ shows that variation in amplitude in each item of data is further suppressed.

[1-3] Advantageous Effects of First Embodiment

With the receiver circuit 10 according to the first embodiment described above, it is possible to improve the precision in timing adjustment of the clock signal CK. Hereinafter, a description will be given of details of the advantageous effects of the first embodiment.

In a memory system, for example, an interconnect that couples the memory controller MC and the memory device MD may be designed to be short. Thus, in the receiver circuit that is used in communications between the memory controller MC and the memory device MD, the signal loss is suppressed, thus suppressing a request on the compensation ability of the equalizer circuit. On the other hand, when coupling is made between the host apparatus and the memory system via the transmission line 3, the length of the transmission line 3 is not uniform and may cause an increase in the signal loss. Thus, in the receiver circuit used in communications with the outside, a demand for the compensation ability of the equalizer circuit becomes high. As the data rate handled in communications increases, there is a possibility that a receiver circuit (analog receiver circuit) that performs signal compensation processing using an analog signal might not be able to cope therewith.

On the other hand, the receiver device 4 according to the first embodiment comprises a receiver circuit 10 (digital receiver circuit 10) that compensates for a signal using a digital signal. The digital receiver circuit 10 executes compensation processing using a digital signal, after converting an analog signal into a digital signal. In the compensation processing using a digital signal, taps corresponding to the precursor can be utilized, thus improving the signal compensation ability.

Also, the receiver circuit 10 according to the first embodiment executes the second parameter adjusting operation, adjusts the tap coefficient of each of the taps of the second equalizer 60, and adjusts the tap coefficient $a_1$ of TAPpost1 of the first equalizer 50 based on the adjustment result of each tap coefficient of the second equalizer 60. Briefly speaking, the receiver circuit 10 according to the first embodiment executes an LMS loop with TAPpost1 of the first FFE part 51 fixed, and adjusts TAPpost1 at the stage where the LMS loop has converged.

FIG. 18 is a histogram for illustrating the effects of the timing adjustment method of the receiver circuit 10 according to the first embodiment. In the receiver circuit 10 according to the first embodiment, the adjustment frequency of h(1) is set to be low, and h(1) functions as an anchor in the baud rate CDR, as shown in FIG. 18. In this case, the receiver circuit 10 is capable of locking the clock signal CK at the position where an equal sign holds between h(−1) and fixed h(1).

The receiver circuit 10 according to the first embodiment adjusts the tap coefficient $a_1$ of the first equalizer 50 using the tap coefficient $b_1$ calculated by the second equalizer 60. In other words, the receiver circuit 10 according to the first embodiment adjusts the tap coefficient $a_1$ of TAPpost1 of the first equalizer 50 for CDR based on the parameter adjustment result of the second equalizer 60 for data in a second parameter adjusting operation.

Thus, the receiver circuit 10 according to the first embodiment adjusts h(1) while utilizing the lock position adjustment function of the CDR. As a result, the receiver circuit 10 according to the first embodiment is capable of improving the ISI of a signal handled in a CDR loop, and broadening the adjustment range of the clock signal CK. Accordingly, the receiver circuit 10 according to the first embodiment is capable of improving the precision in timing adjustment of the clock signal CK.

In the receiver circuit 10 according to the first embodiment, the first signal S1 compensated for by the first equalizer 50 is input to the second equalizer 60. That is, since data that has been compensated for to a certain degree is input to the second equalizer 60, the compensation ability requested in the second equalizer 60 can be low. As a result, in the receiver circuit 10 of the first embodiment, the number of taps in the second equalizer 60 can be cut down, thus suppressing the cost of the receiver circuit 10.

[2] Second Embodiment

A receiver circuit 10 according to a second embodiment has a configuration similar to that of the receiver circuit 10 according to the first embodiment. The receiver circuit 10 of the second embodiment adjusts a tap coefficient $a_1$ of TAPpost1 of the first equalizer 50 in a second parameter adjusting operation different from that of the first embodiment. Hereinafter, mainly differences from the first embodiment will be described with respect to the receiver circuit 10 according to the second embodiment.

[2-1] Operation

[2-1-1] Second Parameter Adjusting Operation

Figure 19:
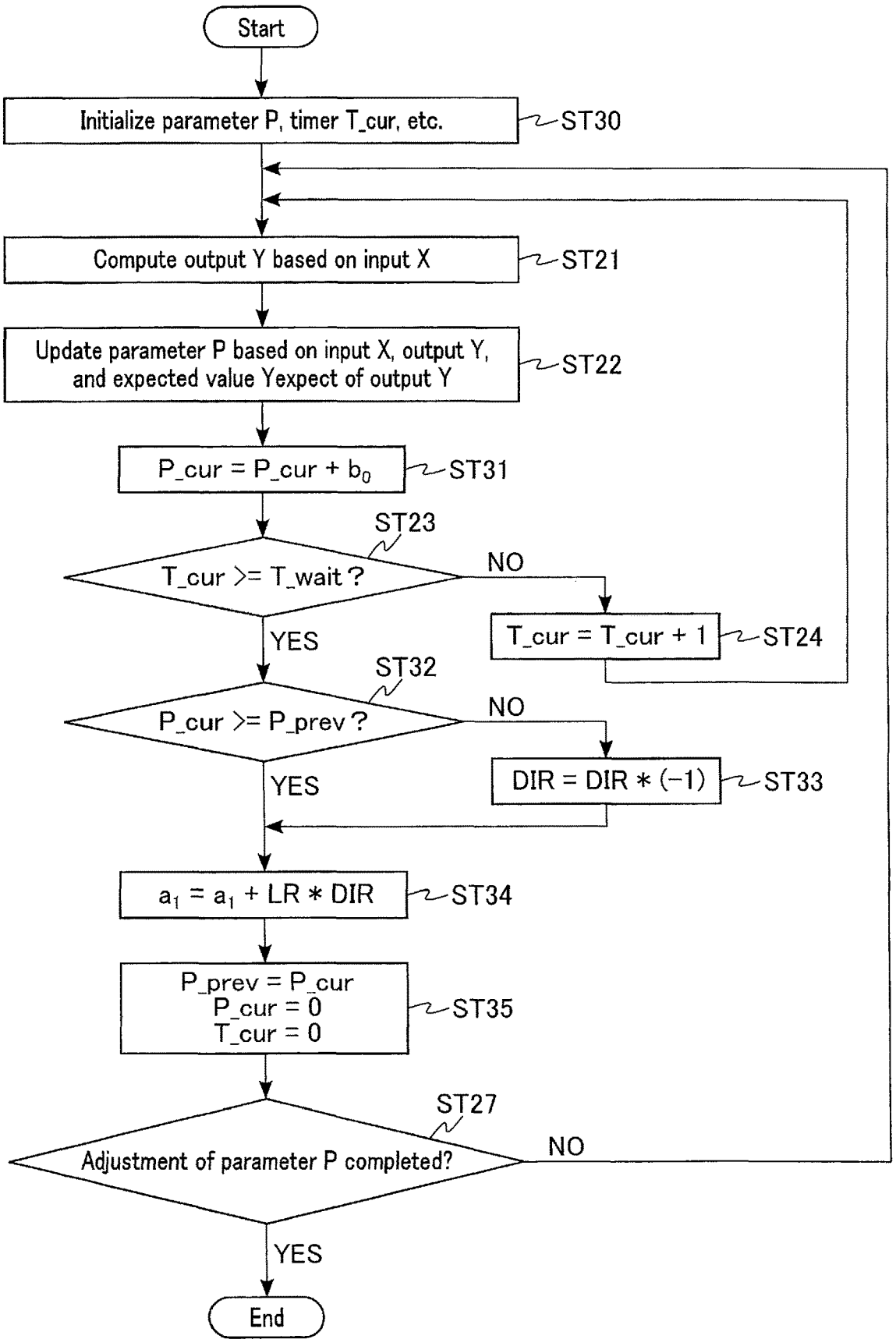
FIG. 19 is a flowchart showing an example of a second parameter adjusting operation of a receiver circuit according to a second embodiment.

FIG. 19 is a flowchart showing an example of a second parameter adjusting operation of the receiver circuit 10 according to the second embodiment. Hereinafter, a description will be given of a second parameter adjusting operation according to the second embodiment, with reference to FIG. 19.

The receiver circuit 10 starts a second parameter adjusting operation in response to, for example, an instruction from the CPU 11 (START).

The receiver circuit 10 initializes a parameter P and a timer T_cur (ST30). The parameter P and the timer T_cur at ST30 are similar to those of the first embodiment. At ST30, parameters P_cur and P_prev, for example, as well as the parameters P and timer T_cur are initialized (e.g., reset). The parameters P_cur and P_prev are, for example, parameters for monitoring changes in the tap coefficient $b_0$, and are used in determination conditions to be described later.

Subsequently, the receiver circuit 10 computes an output Y based on the input X, similarly to the first embodiment (ST21).

Subsequently, the receiver circuit 10 updates a parameter P based on the input X, the output Y, and an expected value Yexpect of the output Y, similarly to the first embodiment (ST22).

Subsequently, the receiver circuit 10 executes the process of "P_cur=P_cur+$b_0$" (ST31). That is, in the processing at ST31, the updated tap coefficient $b_0$ is added to the parameter P_cur.

Subsequently, the receiver circuit 10 confirms whether "T_cur>=T_wait" is satisfied, similarly to the first embodiment (ST23).

If "T_cur>=T_wait" is not satisfied (NO in ST23), the receiver circuit 10 proceeds with the processing at ST24. In the processing of ST24, the receiver circuit 10 executes the processing of "T_cur=T_cur+1", similarly to the first embodiment.

Subsequent to the processing at ST24, the receiver circuit 10 proceeds with the processing at ST21. That is, the receiver circuit 10 executes adjustment of the parameter P at ST21 and ST22 again.

If "T_cur>=T_wait" is satisfied (YES in ST23), the receiver circuit 10 proceeds with the processing at ST32. In the processing at ST32, the receiver circuit 10 confirms whether "P_cur>=P_prev" is satisfied.

If "P_cur>=P_prev" is not satisfied (YES in ST32), the receiver circuit 10 proceeds with the processing at ST33. In the processing at ST33, the receiver circuit 10 executes the processing of "DIR=DIR*(−1)". That is, in the processing at ST33, the sign of DIR is inverted. After the processing at ST33, the receiver circuit 10 proceeds with the processing at ST34.

If "P_cur>=P_prev" is satisfied (YES in ST32), the receiver circuit 10 proceeds with the processing at ST34.

In the processing at ST34, the receiver circuit 10 executes the processing of "$a_1=a_1$+LR*DIR". That is, in the processing at ST34, the tap coefficient a1 is adjusted based on LR and DIR.

After the processing at ST34, the receiver circuit 10 executes the processing of "P_prev=P_cur", "P_cur=0", and "T_cur=0" in order (ST35). That is, the receiver circuit 10 substitutes P_cur for P_prev, and then resets P_cur and T_cur.

Subsequent to the processing at ST35, the receiver circuit 10 confirms whether the adjustment of the parameter P has been completed (ST27). Whether adjustment of the parameter P has been completed or not may be determined by the second control part 90, or may be determined based on the CDR circuit 71 of the clock control part 70 having been locked.

If adjustment of the parameter P has not been completed (NO at ST27), the receiver circuit 10 proceeds with the processing at ST21. That is, the receiver circuit 10 executes adjustment of the parameter P at ST21 and ST22, and updating of the parameter of the tap coefficient $a_1$ in a particular cycle.

If the adjustment of the parameter P has been completed (YES in ST27), the receiver circuit 10 ends the second parameter adjusting operation (END).

[2-1-2] Simulation Results

FIG. 20 is a schematic diagram showing an example of a simulation result of first and second parameter adjusting operations of the receiver circuit 10 according to the second embodiment. In FIG. 20, the lateral axis of each schematic diagram denotes a common time, and the vertical axis of the schematic diagram denotes the value of a tap coefficient. In FIG. 20, each of (A) and (B) denotes changes of some of the tap coefficients used in the first equalizer 50 and the second equalizer 60.

As shown in FIG. 20, when the first and second parameter adjusting operations start, the tap coefficients $a_{-2}$, $a_{-1}$, $a_1$, and $a_2$ of the first equalizer 50 and the tap coefficient $b_0$ of the second equalizer 60 start to change. For example, if "T_cur>=T_wait" is satisfied (YES in ST23), as shown by the flowchart in FIG. 19, the tap coefficient $a_1$ is updated once (ST34). On the other hand, the other tap coefficients are updated every cycle in which "T_cur>=T_wait" is not satisfied (NO in ST23) (ST22). Accordingly, as shown in FIG. 20, the update frequency of the tap coefficient a1 is lower than the update frequency of the other tap coefficients. When, for example, the CDR circuit 71 is locked, the updating of each tap coefficient is stopped.

[2-2] Advantageous Effects of Second Embodiment

As described above, the receiver circuit 10 according to the second embodiment controls the parameters of the FFE circuit for CDR based on a determination criteria. Briefly speaking, the receiver circuit 10 adjusts the FFE circuit (first equalizer 50) for CDR which compensates for a signal handled in a CDR loop and adjusts an FFE circuit and a DFE circuit (second equalizer 60) for data which compensates for a signal used in data comparator. The receiver circuit 10 monitors, for example, $b_0$ at a particular interval, and increases and decreases the value of $a_1$ based on the value of the previously monitored $b_0$ and the current value of $b_0$.

For example, when "P_cur>P_prev" is satisfied, namely, when the opening of the eye pattern is broadened, the receiver circuit 10 continues the previous adjustment. On the other hand, the receiver circuit 10 adjusts $a_1$ in a direction opposite to the previous direction when "P_cur>P_prev" is not satisfied. In other words, in a second parameter adjusting operation, the receiver circuit 10 according to the second embodiment periodically adds or subtracts the value of the tap coefficient $a_1$ of TAPpost1 based on changes in the value (i.e., gain) of the tap coefficient of one of the taps of the second equalizer 60.

In this manner, the receiver circuit 10 according to the second embodiment finely adjusts the tap coefficient $a_1$ corresponding to h(1) compared to the first embodiment, while utilizing the function of the CDR of adjusting the lock position, similarly to the first embodiment. As a result, the receiver circuit 10 according to the second embodiment is capable of improving the ISI of a signal handled in a CDR loop, compared to the first embodiment. Also, the receiver circuit 10 according to the second embodiment is capable of improving the precision in timing adjustment of a clock signal CK, similarly to the first embodiment.

In the second parameter adjusting operation of the receiver circuit 10 according to the second embodiment, parameters of the CDR circuit 71 are adjusted in such a manner that the gain of the center tap decreases. The gain of the center tap being large corresponds to the amplitude of the original signal being small. Accordingly, the gain of the center tap being the minimum corresponds to the CDR being locked at a position where the amplitude of the signal becomes the maximum. In this manner, the receiver circuit 10 according to the second embodiment is capable of locking the CDR at more preferable conditions, thus improving the precision in timing adjustment of the clock signal CK. Correcting the gain of the center tap to be the minimum is applicable to both the FFE circuit for CDR and the FFE circuit for data.

[3] Third Embodiment

A receiver circuit 10 according to a third embodiment executes processing similar to that of the first embodiment using a first equalizer 50 and a second equalizer 60 with an arrangement different from that of the receiver circuit 10 of the first embodiment. Hereinafter, differences from the first and second embodiments will be described with respect to the receiver circuit 10 of the third embodiment.

[3-1] Configuration

[3-1-1] Configuration of Receiver Circuit 10

Figure 21:
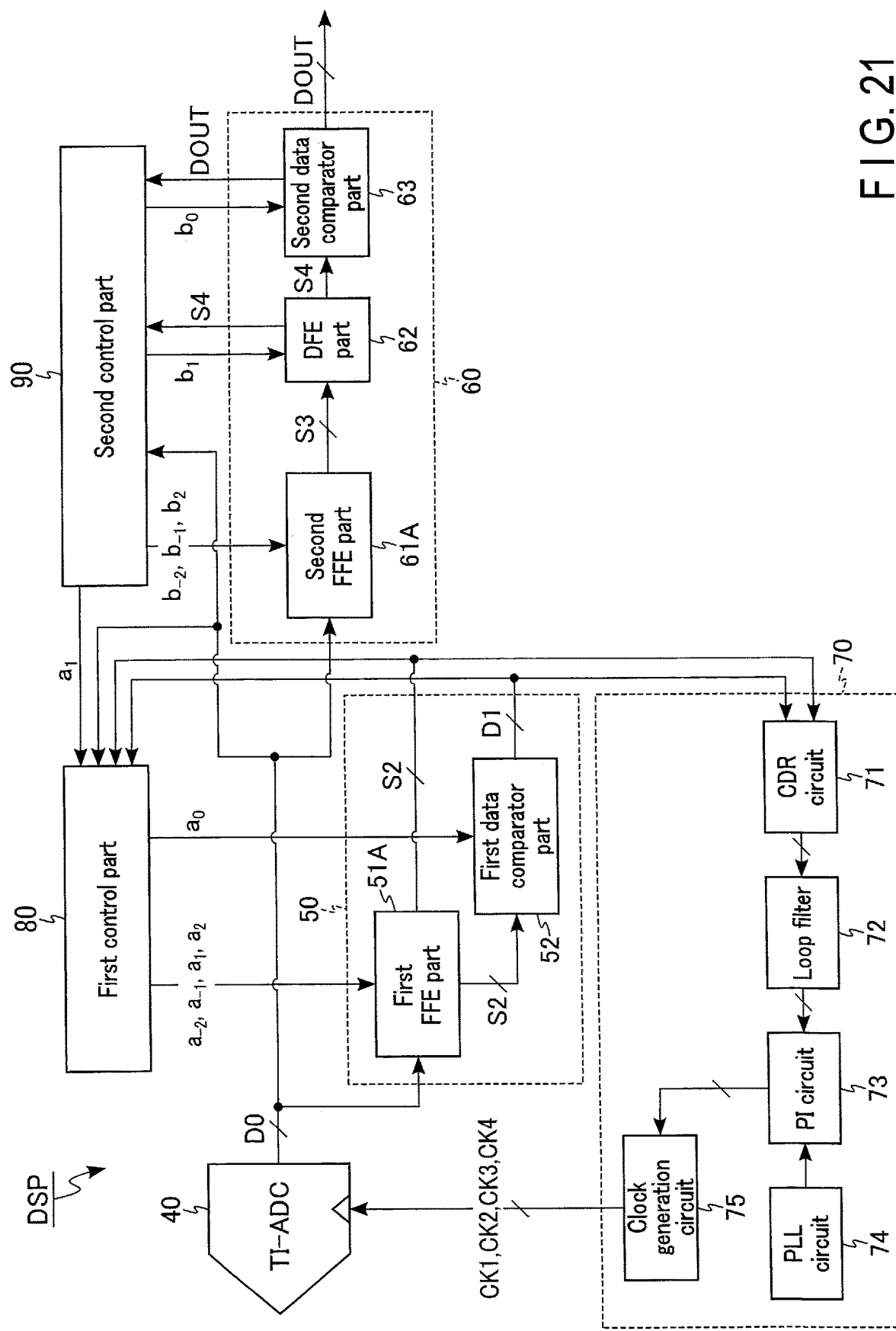
FIG. 21 is a block diagram showing an example of a configuration of a digital signal processor of a receiver circuit according to a third embodiment.

FIG. 21 is a block diagram showing an example of a configuration of a digital signal processor DSP of the receiver circuit 10 according to the third embodiment. As shown in FIG. 21, the digital signal processor DSP of the third embodiment differs from the digital signal processor DSP of the first embodiment in terms of the coupling relationship between the A/D converter part 40 and a first FFE part 51A and a second FFE part 61A.

Specifically, the first FFE part 51A of the third embodiment performs compensation processing for each of the input digital values D0 using some of the previous and subsequent digital values, and generates a second signal S2. The second FFE part 61A according to the third embodiment performs compensation processing for each of the input digital values D0 using some of the digital values of the previous and subsequent unit intervals, thereby generating a third signal S3.

That is, in the receiver circuit 10 according to the third embodiment, each of the first equalizer part 50 and the second equalizer part 60 executes compensation processing using a digital value D0 output from the A/D converter part 40. In other words, the receiver circuit 10 according to the third embodiment has a configuration in which the signal path of the first equalizer 50 used in timing adjustment of a clock signal and the processing path of the second equalizer 60 used in compensation processing of data DOUT are separated. The other coupling relationship of the digital signal processor DSP according to the third embodiment is similar to that of the digital signal processor DSP of the first embodiment.

[3-1-2] Configuration of First FFE Part 51A

Figure 22:
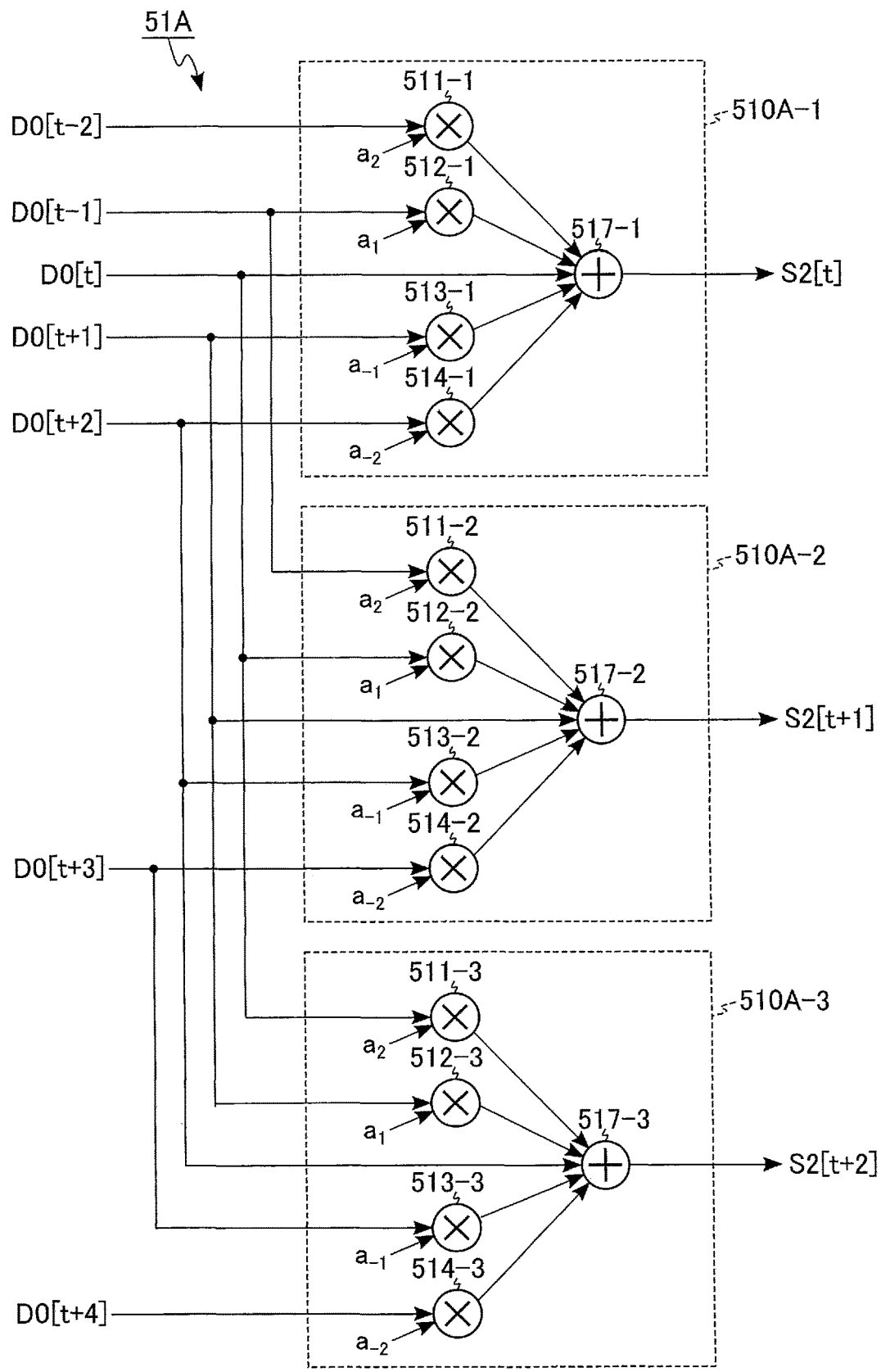
FIG. 22 is a diagram showing an example of a configuration of a first FFE part included in the receiver circuit according to the third embodiment.

FIG. 22 is a diagram showing an example of a configuration of a first FFE part 51A included in the receiver circuit 10 according to the third embodiment. As shown in FIG. 22, the first FFE part 51A according to the third embodiment includes an FFE circuit 510A-1, an FFE circuit 510A-2, and an FFE circuit 510A-3. Each of the FFE circuits 510A-1, 510A-2, and 510A-3 includes multipliers 511, 512, 513, and 514, and an adder 517.

Each multiplier 511 of the FFE circuit 510A multiplies the input digital value D0 with the tap coefficient $a_2$, and inputs the multiplication result into the adder 517. Each multiplier 512 of the FFE circuit 510A multiplies the input digital value D0 with the tap coefficient $a_{-1}$, and inputs the multiplication result into an adder 517. Each multiplier 513 of the FFE circuit 510A multiplies the input digital value D0 with the tap coefficient $a_{-1}$, and inputs the multiplication result into an adder 517. Each multiplier 514 of the FFE circuit 510A multiplies the input digital value D0 with the tap coefficient $a_{-2}$, and inputs the multiplication result into the adder 517.

Each adder 517 of the FFE circuit 510A corresponds to the center tap in the first FFE part 51A of the third embodiment. Each adder 517 of the FFE circuit 510A adds a plurality of multiplication results input from the multipliers 511, 512, 513, and 514 associated therewith and the input digital value D0, and outputs the addition result as a second signal S2. That is, in the third embodiment, the second signal S2 corresponds to the sum of the outputs of all the taps handled by the first FFE part 51A.

In the present example, digital values D0[$t$], D0[$t$+1], and D0[$t$+2] are respectively input to the respective center taps of the FFE circuits 510A-1, 510A-2, and 510A-3. In this case, digital values D0[$t$−2], D0[$t$−1], D0[$t$+1], and D0[$t$+2] are input to the multipliers 511-1, 512-1, 513-1, and 514-1 of the FFE circuit 510A-1. Digital values D0[$t$−1], D0[$t$], D0[$t$+2], and D0[$t$+3] are respectively input to the multipliers 511-2, 512-2, 513-2, and 514-2 of the FFE circuit 510A-2. Digital values D0[$t$], D0[$t$+1], D0[$t$+3], and D0[$t$+4] are input to the multipliers 511-3, 512-3, 513-3, and 514-3 of the FFE circuit 510A-3.

Similarly, digital values D0 of one-unit interval shifted unit intervals of time when the A/D conversion process is performed by the A/D converter part 40 are input to the FFE circuits 510A included in the first FFE part 51A. As a result, the FFE circuits 510A-1, 510A-2, 510A-3, . . . , and 510A-N respectively output second signals S2[$t$], S2[$t$+1], S2[$t$+2], . . . , and S2[$t$+(N−1)].

[3-1-3] Configuration of Second FFE Part 61A

FIG. 23 is a diagram showing an example of a configuration of the second FFE part 61A included in the receiver circuit 10 according to the third embodiment. As shown in FIG. 23, the second FFE part 61A according to the third embodiment includes an FFE circuit 610A-1, an FFE circuit 610A-2, and an FFE circuit 610A-3. Each of the FFE circuits 610A-1, 610A-2, and 610A-3 includes multipliers 611, 612, and 613, and an adder 614, similarly to the first embodiment.

In the third embodiment, digital values D0[$t$], D0[$t$+1], and D0[$t$+2] are respectively input to the respective center taps of the FFE circuits 610A-1, 610A-2, and 610A-3. Similarly, digital values D0 of one-unit interval shifted unit intervals of time when the A/D conversion process is performed by the A/D converter part 40 are input to the FFE circuits 610A included in the second FFE part 61A. As a result, the FFE circuits 610A-1, 610A-2, 610A-3, . . . , and 610A-N respectively output third signals S3[$t$], S3[$t$+1], S3[$t$+2], . . . , and S3[$t$+(N−1)]. The other configurations of the receiver circuit 10 of the third embodiment are similar to those of the first embodiment.

[3-2] Advantageous Effects of Third Embodiment

The receiver circuit 10 according to the third embodiment may be combined with either the first embodiment or the second embodiment. For example, the receiver circuit 10 according to the third embodiment may execute the second parameter adjusting operation of the first embodiment, or execute the second parameter adjusting operation of the second embodiment. Even in such a case, the receiver circuit 10 according to the third embodiment is capable of improving the ISI of a signal handled in a CDR loop, similarly to the first or second embodiment, thus improving the prevision in timing adjustment of the clock signal CK.

[4] Fourth Embodiment

A receiver circuit 10 according to a fourth embodiment executes a second parameter adjusting operation in consideration of variation in differential ERR. Hereinafter, differences from the first to third embodiments will be described with respect to the receiver circuit 10 according to the fourth embodiment.

[4-1] Configuration of Second Control Part 90A

Figure 24:
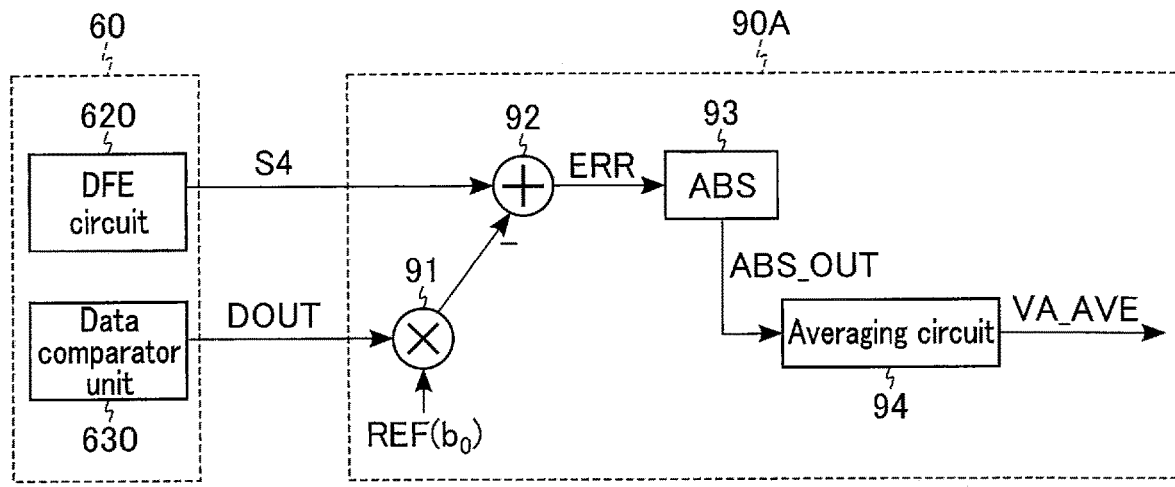
FIG. 24 is a diagram showing an example of a configuration of a second control part included in a receiver circuit according to a fourth embodiment.

FIG. 24 is a diagram showing an example of a configuration of a second control part 90A included in the receiver circuit 10 according to the fourth embodiment. For the processing of the second control part 90A described below, the configuration inside the second equalizer 60 may be utilized. As shown in FIG. 24, a second control part 90A of the fourth embodiment includes, for example, an multiplier 91, an adder 92, an ABS circuit 93, and an averaging circuit 94.

The multiplier 91 is similar to the multiplier 84 described in the first embodiment. The multiplier 84 multiplies data DOUT with a reference value REF($b_0$), and inputs the multiplication result to the adder 92.

The adder 92 is similar to the adder 85 described in the first embodiment. The adder 92 adds a fourth signal S4 output from the DFE circuit 620 and a value obtained by multiplying the multiplication result input from the multiplier 91 with (−1). In other words, the adder 92 subtracts, from the fourth signal S4 (equalization result), the multiplication result input from the multiplier 91. The addition result of the adder 92 is output as a differential ERR, and input to the ABS circuit 93.

The ABS circuit 93 calculates an absolute value of the differential ERR input from the adder 92. The ABS circuit 93 inputs the calculation result to the averaging circuit 94 as ABS_OUT. Hereinafter, a computation process performed by the ABS circuit 93 will be referred to as an "ABS process".

The averaging circuit 94 accumulates ABS_OUT input from the ABS circuit 93, and calculates a mean value of the accumulated ABS_OUT. The averaging circuit 94 outputs the mean value of ABS_OUT as VA_AVE. The other configurations of the receiver circuit 10 according to the fourth embodiment are similar to those of the receiver circuit 10 of the first embodiment.

Figure 25:
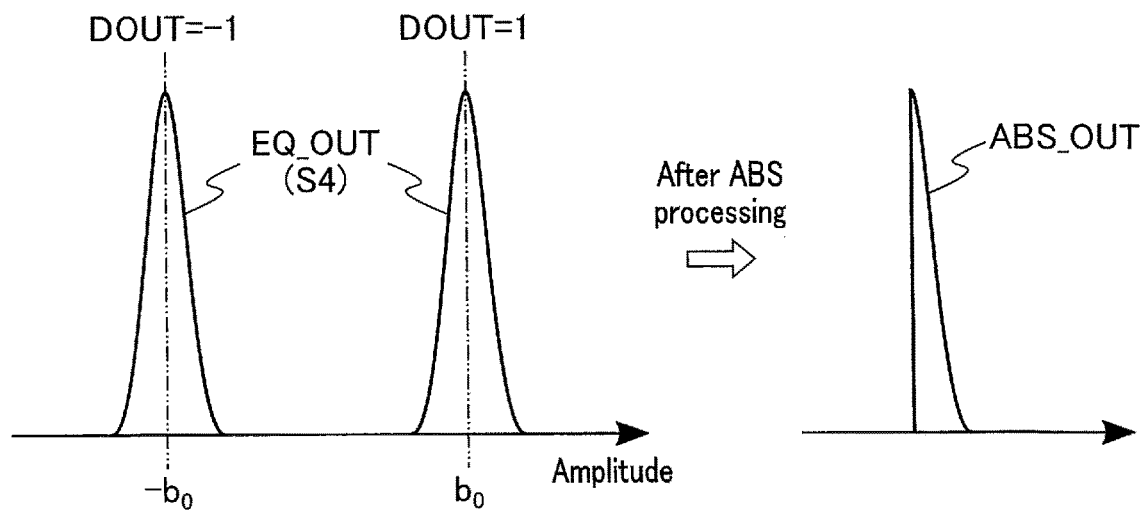
FIG. 25 is a histogram for illustrating processings of the second control part included in the receiver circuit according to the fourth embodiment.

FIG. 25 is a histogram for illustrating the processings of the second control part 90A included in the receiver circuit 10 according to the fourth embodiment. The left side of FIG. 25 shows a distribution of a fourth signal S4 prior to subjection to an ABS process, and the right side of FIG. 25 shows a distribution of a signal ABS_OUT after execution of the ABS process. As shown in FIG. 25, prior to the ABS process, a fourth signal S4(EQ_OUT) is distributed in the vicinity of DOUT=1 or DOUT=−1 based on data DOUT. Distributions of each of the signals of DOUT=1 and DOUT=−1 are multiplied by computation performed by the multiplier 91, and a differential ERR is calculated by computation performed by the adder 92. Thereafter, the absolute value (ABS_OUT) of the differential ERR is calculated by the ABS process, and distributions of positive values representing differences (variation) from the center of the distributions are formed, as shown in FIG. 25. As a result, the averaging circuit 94 is capable of calculating the size of variation of the fourth signal S4 based on ABS_OUT.

[4-2] Second Parameter Adjusting Operation

Figure 26:
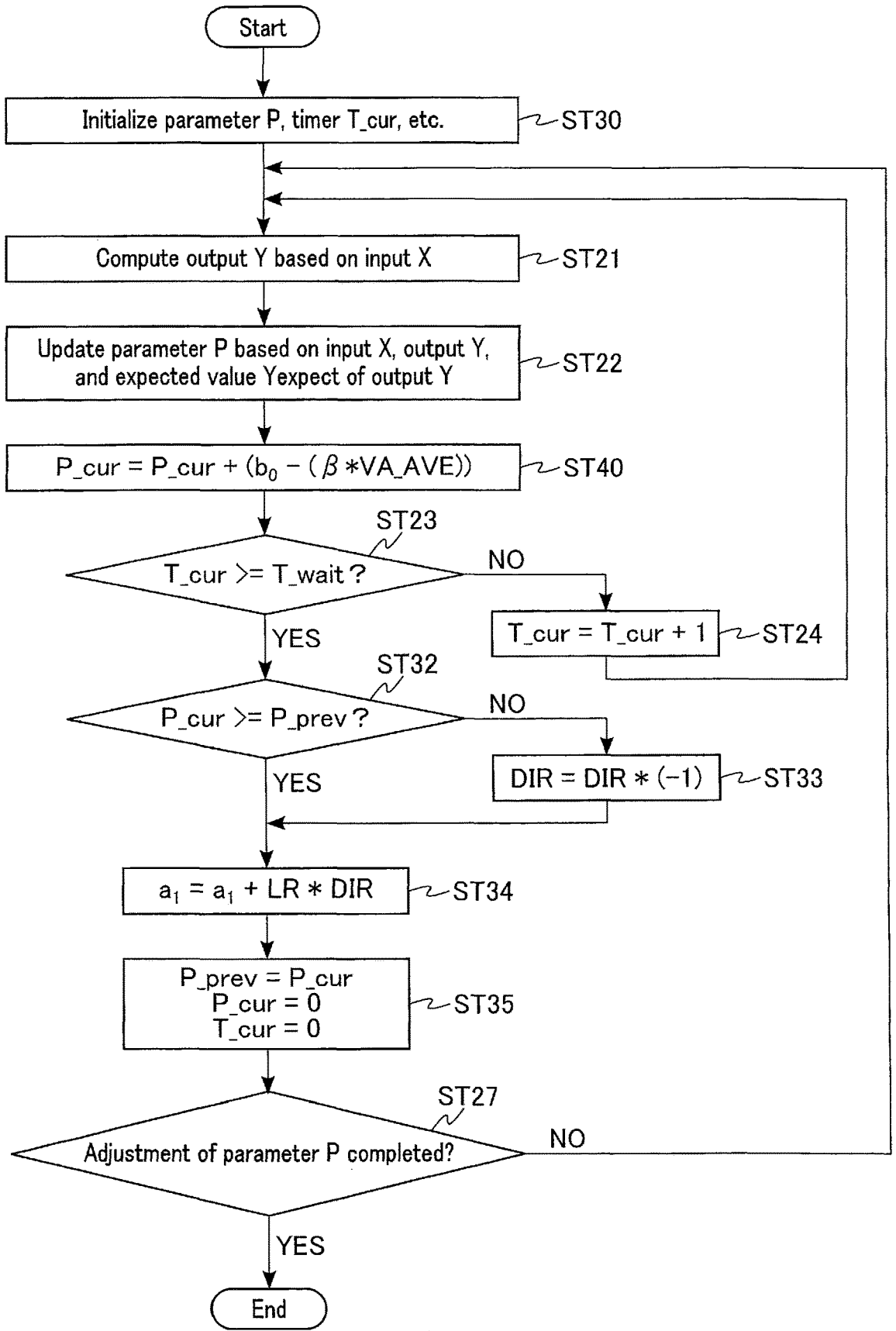
FIG. 26 is a flowchart showing an example of a second parameter adjusting operation of the receiver circuit according to the fourth embodiment.

FIG. 26 is a flowchart showing an example of a second parameter adjusting operation of the receiver circuit 10 according to the fourth embodiment. As shown in FIG. 26, the second parameter adjusting operation of the fourth embodiment has a configuration in which ST31 shown in FIG. 19 is substituted with ST40 in the second parameter adjusting operation of the second embodiment.

In the process of ST40, the receiver circuit 10 executes the process of "P_cur=P_cur+($b_0$−(f*VA_AVE))". That is, the updated tap coefficient $b_0$ is added to the parameter P_cur, and a value obtained by multiplying VA_AVE with a certain coefficient β is subtracted. Assuming a normal distribution, "VA_AVE=$\sigma\sqrt{2/\pi}$" is satisfied. For example, when variation of up to 3σ is taken into consideration, "β=$3\sqrt{\pi/2}$" is set.

Thereby, in the process at ST32, a determination ("P_cur>−P_prev") is executed taking into consideration variation in the fourth signal S4. The other operations of the receiver circuit 10 according to the fourth embodiment are similar to those of the receiver circuit 10 of the second embodiment. The process at ST40 may be executed in the second parameter adjusting operation according to the third embodiment. That is, the fourth and third embodiments may be combined.

[4-3] Advantageous Effects of Fourth Embodiment

As described above, the receiver circuit 10 according to the fourth embodiment utilizes variation in absolute value (ABS_OUT) of a difference between data DOUT determined by the second data comparator part 63 and the expected value based on the fourth signal S4. The receiver circuit 10 according to the fourth embodiment adjusts a control parameter ("α") of the CDR circuit 71 in such a manner that the gain of the center tap decreases in consideration of variation (VA_AVE) in ABS_OUT. Specifically, the receiver circuit 10 executes a CDR loop and an LMS loop in such a manner that "b0−β*VA_AVE" is maximized.

Thereby, the receiver circuit 10 according to the fourth embodiment is capable of adjusting the parameters of the CDR circuit 71 with higher precision than that of the second embodiment, and is capable of locking the CDR at more preferable conditions. As a result, the receiver circuit 10 according to the fourth embodiment is capable of improving the precision in timing adjustment of the clock signal CK compared to the second embodiment. Correcting the gain of the center tap to be the minimum in consideration of the variation is applicable to both the FFE circuit for CDR and the FFE circuit for data.

[5] Fifth Embodiment

A receiver circuit 10 according to a fifth embodiment has, for example, a configuration similar to that of the third embodiment. In the baud rate CDR of the fifth embodiment, "α" is adjusted in such a manner, for example, that the formula "α*Early value−(1−α)*Late value=0(0.5<α<1)" is satisfied. The "Early value" corresponds to the intensity of a signal at h(−1). The "Late value" corresponds to the intensity of a signal at h(1). When, for example, the formula "α*Early value−(1−α)*Late value=0(0.5<α<1)" is satisfied by a CDR loop, the clock signal CK is locked. In the receiver circuit 10 according to the fifth embodiment, adjustment of the tap coefficient $a_1$ in a CDR loop is omitted. Hereinafter, mainly differences from the first to fourth embodiments will be described with respect to the receiver circuit 10 according to the fifth embodiment.

[5-1] Operation

[5-1-1] Second Parameter Adjusting Operation

Figure 27:
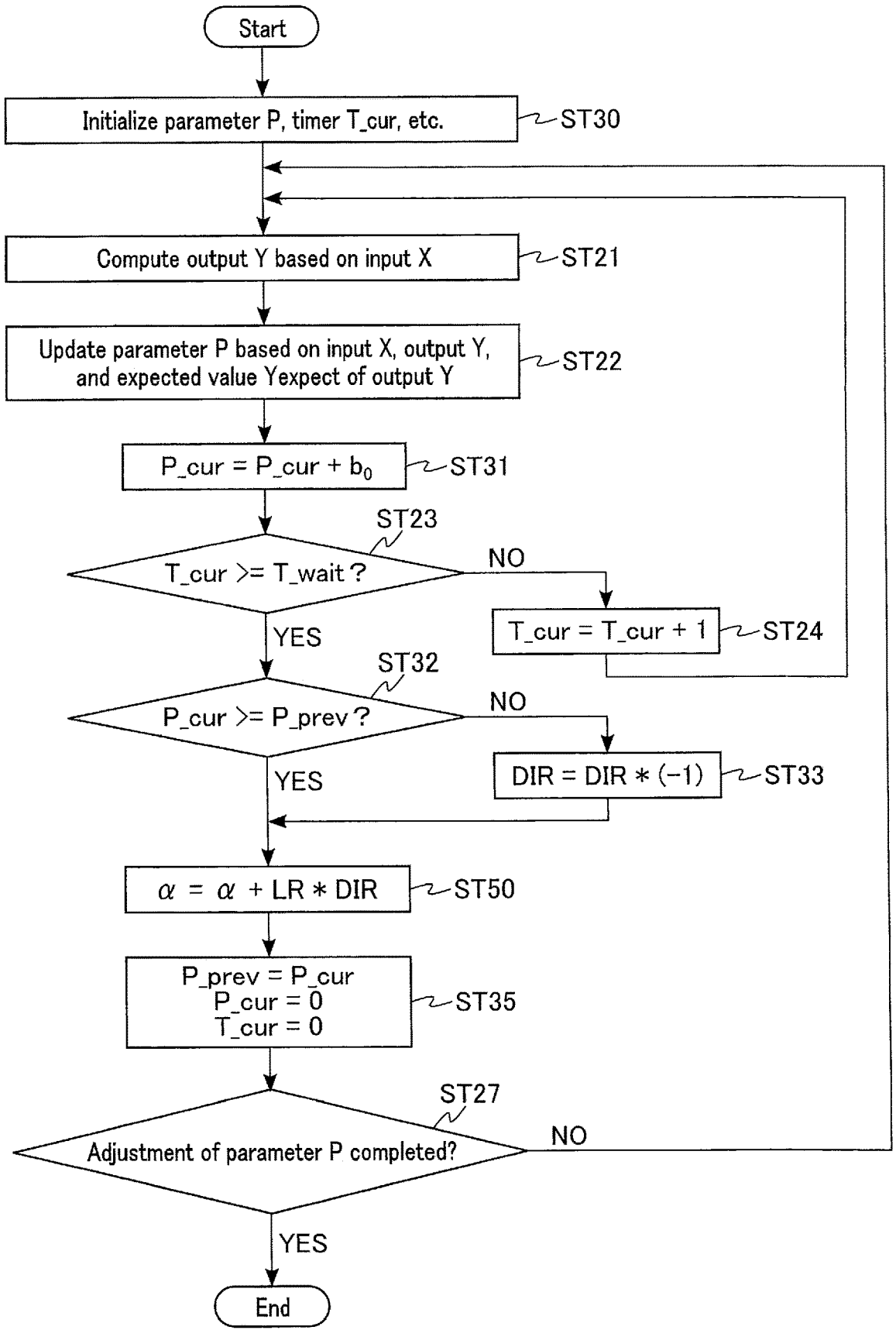
FIG. 27 is a flowchart showing an example of a second parameter adjusting operation of a receiver circuit according to a fifth embodiment.

FIG. 27 is a flowchart showing an example of a second parameter adjusting operation of the receiver circuit 10 according to the fourth embodiment. As shown in FIG. 27, the second parameter adjusting operation of the fifth embodiment has a configuration in which ST34 shown in FIG. 19 is substituted with ST50 in the second parameter adjusting operation of the second embodiment.

In the process at ST50, the receiver circuit 10 executes the process of "α=α+LR*DIR". That is, "α" used in a CDR loop is adjusted based on a particular adjustment value (LR) and an adjustment direction (DIR). The other configurations of the second parameter adjusting operation according to the fifth embodiment are similar to those of the second parameter adjusting operation according to the second embodiment.

In the second parameter adjusting operation according to the fifth embodiment, the process at ST34 may be executed. In this case, the process at ST34 is inserted between, for example, ST50 and ST35. The process at ST50 may be executed in the second parameter adjusting operation according to the first to fourth embodiments. In this case, DIR used in adjustment of the tap coefficient $a_1$ and DIR used in adjustment of "α" are independently managed.

[5-1-2] Simulation Results

FIG. 28 is a schematic diagram showing an example of a change of an eye pattern in a second parameter adjusting operation of the receiver circuit 10 according to the fourth embodiment, and illustrates eye patterns of two-value signals. The lateral axis of each eye pattern shown in FIG. 28 denotes time (phase), and the vertical axis of each eye pattern shown in FIG. 28 denotes an amplitude of the signal. FIG. 28 (A) shows an eye pattern prior to execution of the first and second parameter adjusting operations, namely, before adjustment. FIG. 28 (B) shows an eye pattern after execution of the first and second parameter adjusting operations, namely, after adjustment.

As shown in FIG. 28, an opening height H5 of the eye pattern after the adjustment is greater than an opening height H4 of the eye pattern prior to the adjustment. Also, an opening width W5 of the eye pattern after the adjustment is greater than an opening width W4 of the eye pattern prior to the adjustment. That is, with "α" adjusted by the second parameter adjusting operation, the opening portion of the eye pattern is broadened.

[5-2] Advantageous Effects of Fifth Embodiment

In the receiver circuit 10 according to the fifth embodiment, adjustment of TAPpost1 is omitted from the second parameter adjusting operation of the second embodiment, and an operation of adding correction of a parameter "α" in a CDR loop is executed. The receiver circuit 10 is capable of locking the CDR at a position where the amplitude of the signal is maximized, by adjusting the gain of the first FFE part 51 to decrease. As a result, the receiver circuit 10 according to the fifth embodiment is capable of locking the CDR at more preferable conditions, thus improving the precision in timing adjustment of the clock signal CK.

[5-3] Modifications of Fifth Embodiment

Figure 29:
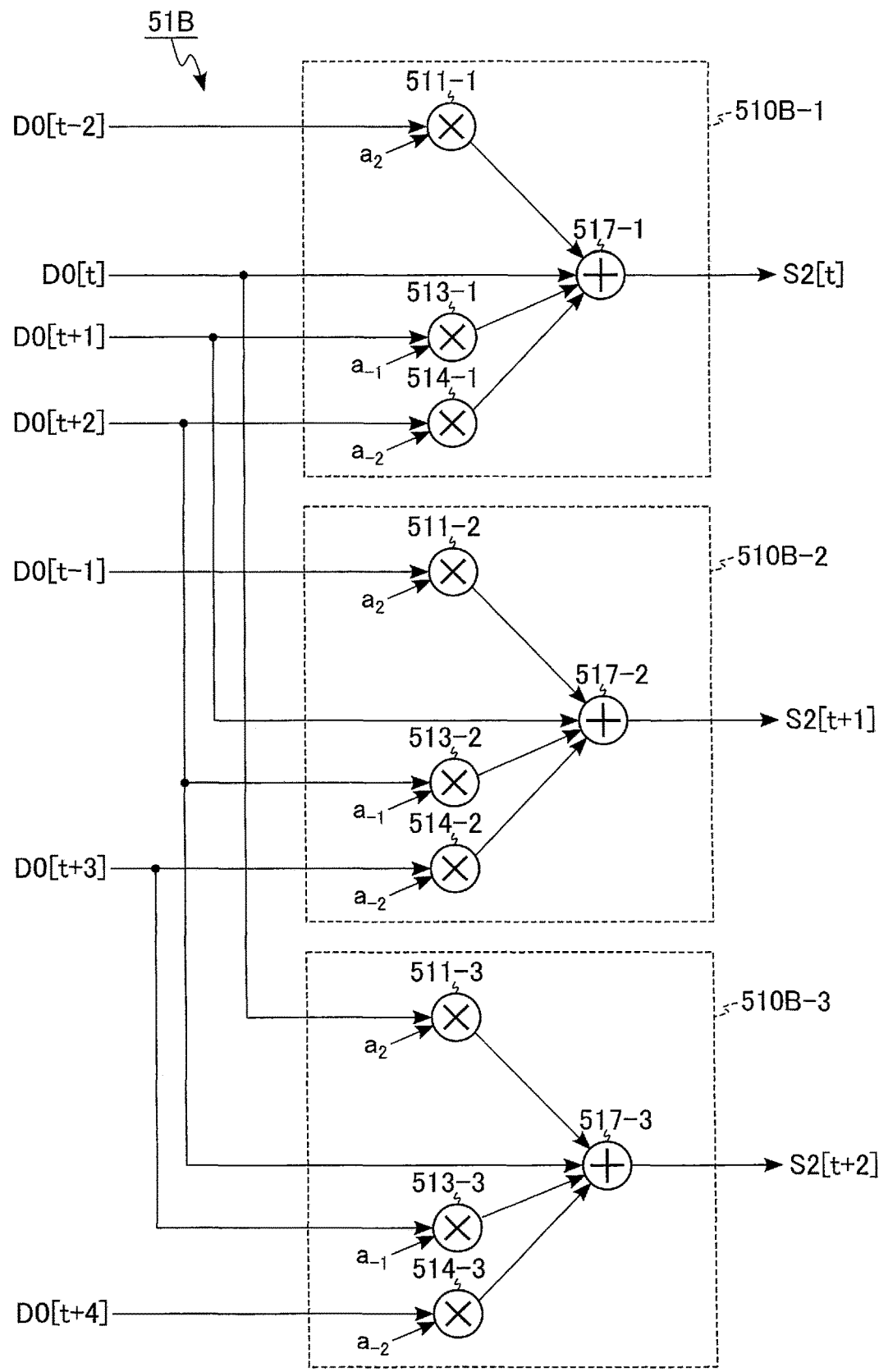
FIG. 29 is a diagram showing an example of a configuration of a first FFE part included in a receiver circuit according to a modification of the fifth embodiment.

FIG. 29 is a diagram showing an example of a configuration of a first FFE part 51B included in the receiver circuit 10 according to a modification of the fifth embodiment. As shown in FIG. 29, the first FFE part 51B according to the modification of the fifth embodiment includes an FFE circuit 510B-1, an FFE circuit 510B-2, and an FFE circuit 510B-3. Each FFE circuit 510B according to the modification of the fifth embodiment has a configuration in which each multiplier 512 is omitted from the FFE circuit 510A of the third embodiment. The other configurations of the receiver circuit 10 according to the modification of the fifth embodiment are similar to those of the receiver circuit 10 of the third embodiment.

As shown in the modification of the fifth embodiment, TAPpost1 may be omitted in the CDR loop of the receiver circuit 10. In this case, the ISI in the cursor h(1) remains, but the receiver circuit 10 is capable of locking the CDR at a position where the amplitude is maximized. The modification of the fifth embodiment is applicable to both the FFE for CDR and the FFE for data.

[6] Modifications, Etc

In the above embodiments, a case has been described where a differential signal is input to a receiver circuit 10; however, the configuration is not limited thereto. A single-phase signal may be input to the receiver circuit 10. With the receiver circuit 10, it is possible to obtain similar advantageous effects as those of the above-described embodiments even when a single-phase signal is input, by configuring the digital signal processor DSP in a manner similar to the above-described embodiment.

The configurations described in the above-described embodiments are merely shown as examples. The number of multipliers and adders may be suitably changed according to the number of taps handled in the first equalizer 50 and the second equalizer. Each of the FFE circuit, the DFE circuit, and the data comparator unit may adjust the signal processing timing by including a delay circuit.

The operations described in the above embodiments are merely shown as examples, and may be suitably varied if features and results similar to those described in the above embodiments are achieved. For example, the order in which the processes are executed may be switched where possible. Also, a process at each ST may be replaced with another process, and part of the process may be omitted.

In the above-described embodiments, a case has been described where an adjustment method applied to the tap coefficient of TAPpost1 differs from that of the other tap coefficients; however, the configuration is not limited thereto. For example, the process applied to TAPpost1 may be applied to TAPpre1. In this case, h(−1) functions as an anchor in a CDR loop. That is, the receiver circuit 10 of which the operation on TAPpost1 is applied to TAPpre1 is capable of locking the clock signal CK, similarly to the above-described embodiment, and is capable of obtaining the same advantageous effects as those of the above-described embodiments.

In the present specification, the term "couple" refers to electrical connection, and does not exclude intervention of another element therebetween. The "compensation processing" refers to, for example, a process of amplifying and compensating for a signal using an equalizer circuit, and may be referred to as an "equalization process". The "A/D converter" may be referred to as an "A/D conversion circuit". The "digital value output from the A/D converter" may be referred to as a "signal". The "clock control part" may be referred to as "a clock control circuit". The "first control part" and the "second control part" may be regarded as "functions assigned to a certain control circuit". The "TAPpre1" may be referred to as a "tap one tap before the center tap". The "TAPpost1" may be referred to as a "tap one tap after the center tap". The "gain of the center tap" corresponds to, for example, the tap coefficient $a_0$ at the first equalizer 50, and corresponds to the tap coefficient $b_0$ at the second equalizer 60. The device that processes data received by the receiver circuit 10 may be referred to as a "data processing device". The data processing device is, for example, a memory controller MS or a memory device MD described in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
an A/D converter configured to convert an analog signal into a digital signal based on a clock signal;

a first equalizer circuit includes a plurality of taps including a first tap that is one tap after a center tap, the first equalizer circuit receiving a signal based on the digital signal and outputting a first signal;
a first data comparator circuit configured to determine data based on the first signal and output the determined data as first data;
a second equalizer circuit includes a plurality of taps, the second equalizer circuit receiving a signal based on the digital signal and outputting a second signal;
a second data comparator circuit configured to determine data based on the second signal and output the determined data to an outside;
a first control circuit configured to adjust a phase of the clock signal based on the first signal and the first data, and input the adjusted clock signal to the A/D converter; and
a second control circuit configured to control each of the first equalizer circuit and the second equalizer circuit, and execute an operation of adjusting a control parameter including a tap coefficient, wherein
in the operation, the second control circuit is configured to adjust a tap coefficient of each of the taps of the second equalizer circuit, and adjust a tap coefficient of the first tap based on an adjustment result of each tap coefficient of the second equalizer circuit.

2. The semiconductor integrated circuit of claim 1, wherein
the taps of the second equalizer circuit include a second tap, and
in the operation, the second control circuit is configured to periodically transfer a value of a tap coefficient of the second tap onto the tap coefficient of the first tap.

3. The semiconductor integrated circuit of claim 2, wherein
the second tap is a tap that is one tap after a center tap of the second equalizer circuit.

4. The semiconductor integrated circuit of claim 1, wherein
in the operation, the second control circuit is configured to periodically add or subtract a value of the tap coefficient of the first tap based on a change in a value of a third tap included in the taps of the second equalizer circuit.

5. The semiconductor integrated circuit of claim 4, wherein
the third tap is a center tap of the second equalizer circuit.

6. The semiconductor integrated circuit of claim 1, wherein
the first equalizer circuit is configured to output a third signal different from the first signal based on the digital signal, and
the second equalizer circuit is configured to output a signal based on the third signal as the second signal.

7. The semiconductor integrated circuit of claim 1, wherein
the second equalizer circuit is configured to output a signal as the second signal, based on the digital signal input without intervention of the first equalizer circuit.

8. The semiconductor integrated circuit of claim 1, wherein
the second control circuit is configured to adjust the tap coefficient of the first tap based on data determined by the second data comparator circuit and a variation in an absolute value of a difference from an expected value based on the second signal.

9. A receiver device comprising:
the semiconductor integrated circuit according to claim 1; and
a data processing circuit configured to utilize data output from the semiconductor integrated circuit.

10. The receiver device of claim 9, wherein
the taps of the second equalizer circuit include a second tap, and
in the operation, the second control circuit is configured to periodically transfer a value of a tap coefficient of the second tap onto the tap coefficient of the first tap.

11. The receiver device of claim 10, wherein
the second tap is a tap that is one tap after a center tap of the second equalizer circuit.

12. The receiver device of claim 9, wherein
in the operation, the second control circuit is configured to periodically add or subtract a value of the tap coefficient of the first tap based on a change in a value of a third tap included in the taps of the second equalizer circuit.

13. The receiver device of claim 12, wherein
the third tap is a center tap of the second equalizer circuit.

14. The receiver device of claim 9, wherein
the first equalizer circuit is configured to output a third signal different from the first signal based on the digital signal, and
the second equalizer circuit is configured to output a signal based on the third signal as the second signal.

15. The receiver device of claim 9, wherein
the second equalizer circuit is configured to output a signal as the second signal, based on the digital signal input without intervention of the first equalizer circuit.

16. The receiver device of claim 9, wherein
the second control circuit is configured to adjust the tap coefficient of the first tap based on data determined by the second data comparator circuit and a variation in an absolute value of a difference from an expected value based on the second signal.

17. A semiconductor integrated circuit comprising:
an A/D converter configured to convert an analog signal into a digital signal based on a clock signal;
a first equalizer circuit configured to receive a signal based on the digital signal and output a first signal;
a second equalizer circuit configured to receive a signal based on the digital signal and output a second signal;
a first data comparator circuit configured to determine data based on the first signal and output the determined data as first data;
a control circuit configured to adjust a phase of the clock signal based on the first signal and the first data by executing an adjusting operation, and input the adjusted clock signal to the A/D converter; and
a second data comparator circuit configured to determine data based on the second signal and output the determined data to an outside, wherein
in the adjusting operation, the control circuit is configured to perform adjustment to make a gain of the first signal decrease.

18. The semiconductor integrated circuit of claim 17, wherein
the first equalizer circuit includes a plurality of taps, and
the taps do not include a tap that is one tap after the center tap.

19. A receiver device comprising:
the semiconductor integrated circuit according to claim 17; and
a data processing circuit configured to utilize data output from the semiconductor integrated circuit.

20. The receiver device of claim 19, wherein
the first equalizer circuit includes a plurality of taps, and
the taps do not include a tap that is one tap after the center tap.

* * * * *